(12) United States Patent
Kuramoto et al.

(10) Patent No.: US 8,202,750 B2
(45) Date of Patent: Jun. 19, 2012

(54) METHOD OF MANUFACTURING SEMICONDUCTOR DEVICE, SEMICONDUCTOR LASER, OPTICAL PICKUP, AND OPTICAL DISK DEVICE WITH NITRIDE TYPE GROUP III-V COMPOUND SEMICONDUCTOR LAYER

(75) Inventors: Masaru Kuramoto, Miyagi (JP); Eiji Nakayama, Miyagi (JP); Yoshitsugu Ohizumi, Miyagi (JP)

(73) Assignee: Sony Corporation, Tokyo (JP)

( * ) Notice: Subject to any disclaimer, the term of this patent is extended or adjusted under 35 U.S.C. 154(b) by 277 days.

(21) Appl. No.: 12/038,329

(22) Filed: Feb. 27, 2008

(65) Prior Publication Data

US 2008/0240190 A1 Oct. 2, 2008

(51) Int. Cl.
*H01L 21/00* (2006.01)
(52) U.S. Cl. ............ 438/41; 438/46; 257/E21.108
(58) Field of Classification Search ........... 438/29, 438/31, 32, 37, 41, 46; 257/E21.087, E21.108
See application file for complete search history.

(56) References Cited

U.S. PATENT DOCUMENTS

| 5,960,024 A | * | 9/1999 | Li et al. ............... 372/96 |
| 5,981,977 A | * | 11/1999 | Furukawa et al. ...... 257/94 |

FOREIGN PATENT DOCUMENTS

| JP | 2000-196188 | 7/2000 |
| JP | 2002-204036 | 7/2002 |
| JP | 2003-036771 | 1/2003 |
| JP | 2003-060298 | 2/2003 |
| JP | 2003-198057 | 7/2003 |
| JP | 2004-134555 | 4/2004 |
| JP | 2005-045009 | 2/2005 |
| JP | 2005-191588 | 7/2005 |
| JP | 2005-294394 | 10/2005 |
| JP | 2006-147814 | 6/2006 |
| JP | 2006-147815 | 6/2006 |

* cited by examiner

*Primary Examiner* — Thanhha Pham
(74) *Attorney, Agent, or Firm* — SNR Denton US LLP

(57) ABSTRACT

A method of manufacturing a semiconductor laser having an end face window structure, by growing over a substrate a nitride type Group III-V compound semiconductor layer including an active layer including a nitride type Group III-V compound semiconductor containing at least In and Ga, the method includes the steps of: forming a mask including an insulating film over the substrate, at least in the vicinity of the position of forming the end face window structure; and growing the nitride type Group III-V compound semiconductor layer including the active layer over a part, not covered with the mask, of the substrate.

21 Claims, 35 Drawing Sheets

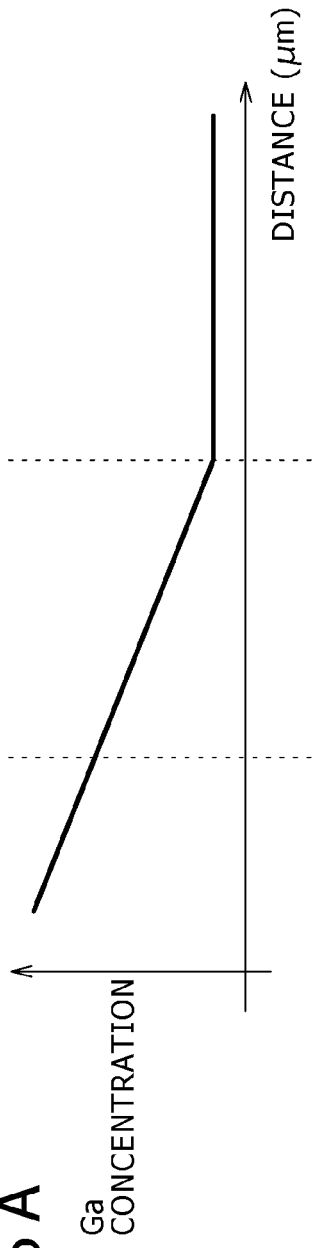
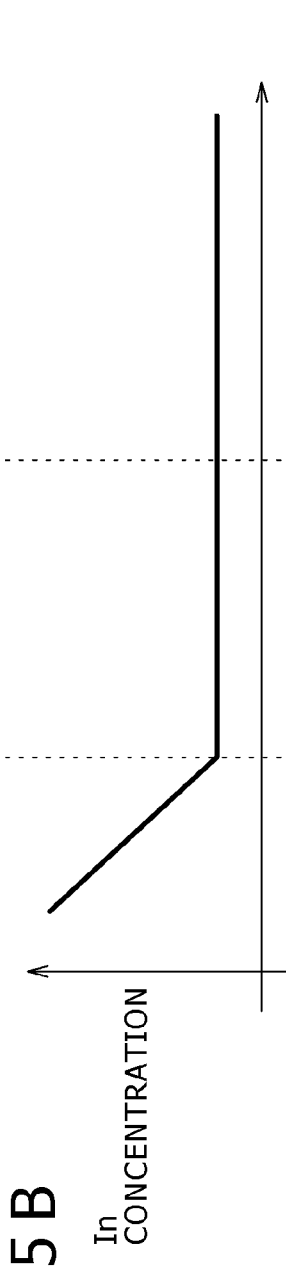
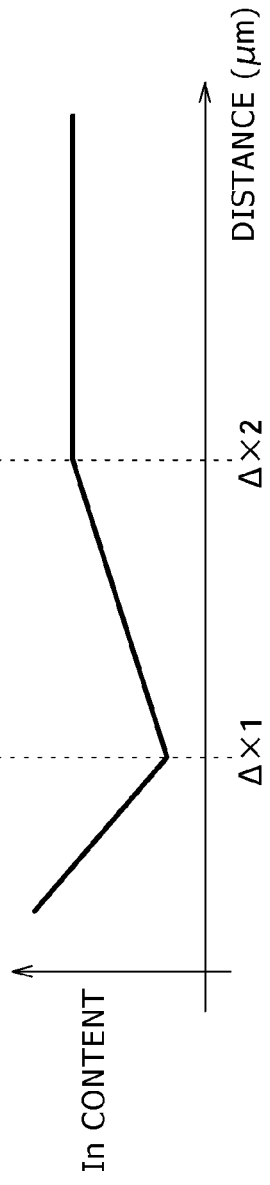

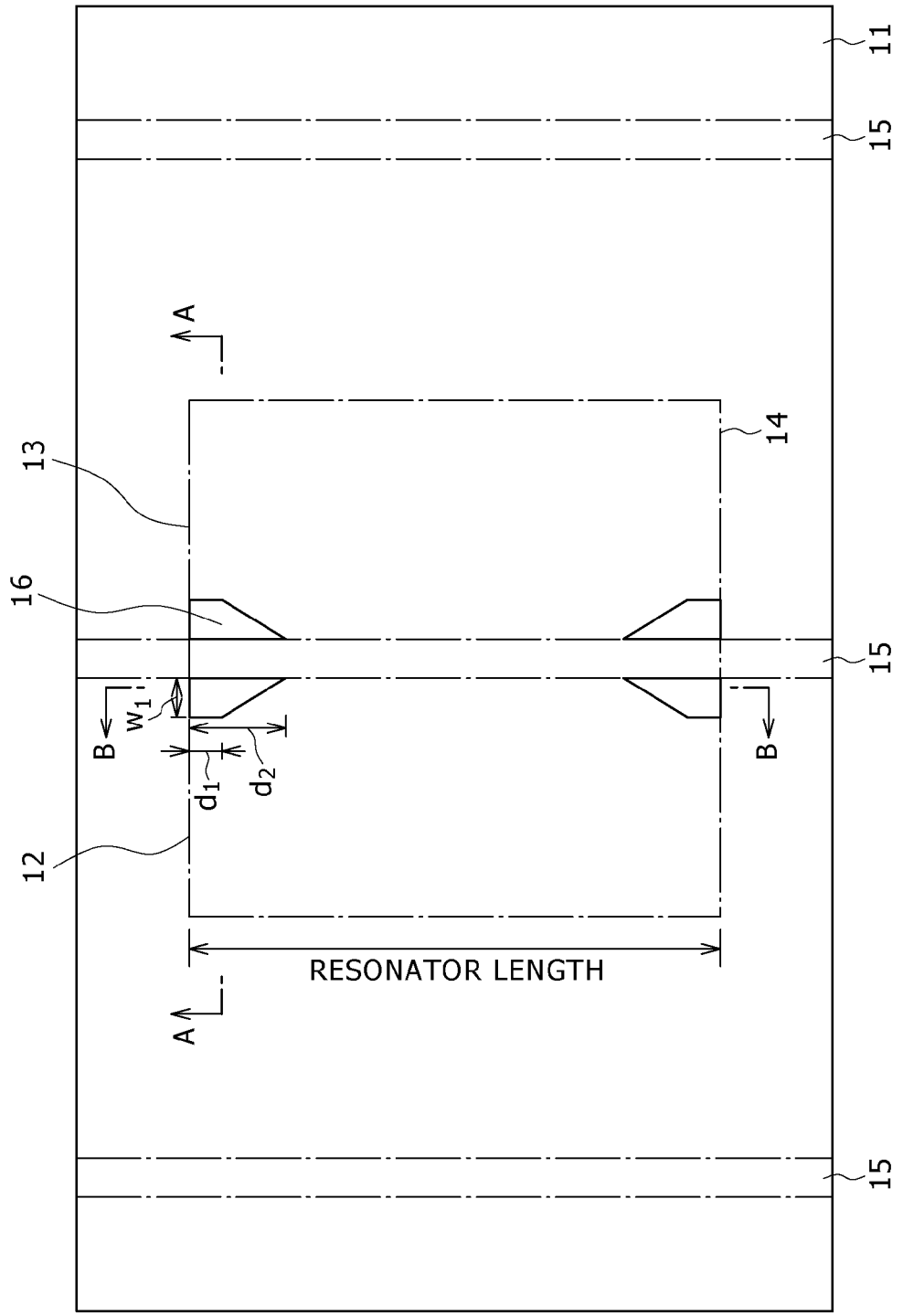

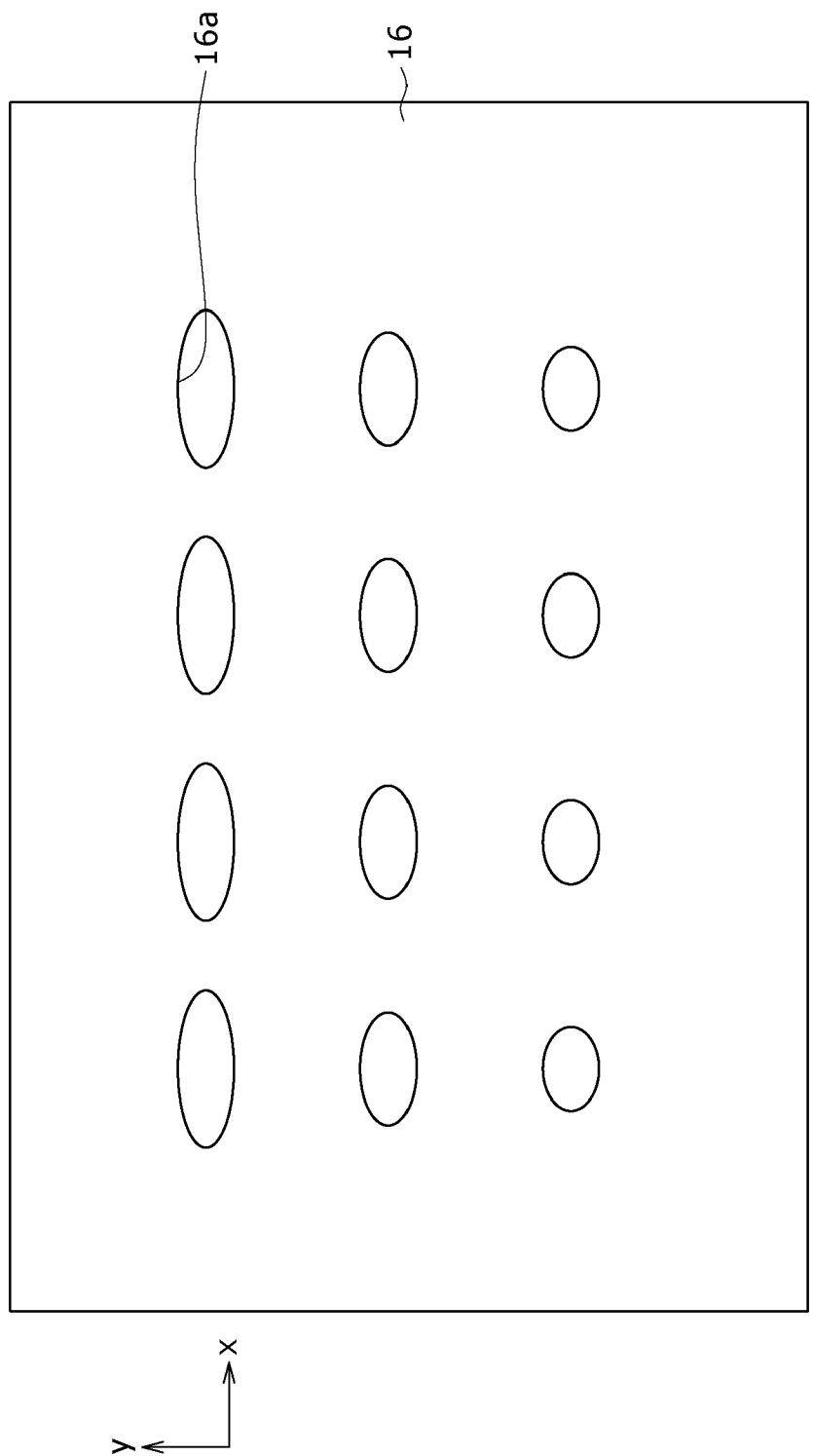

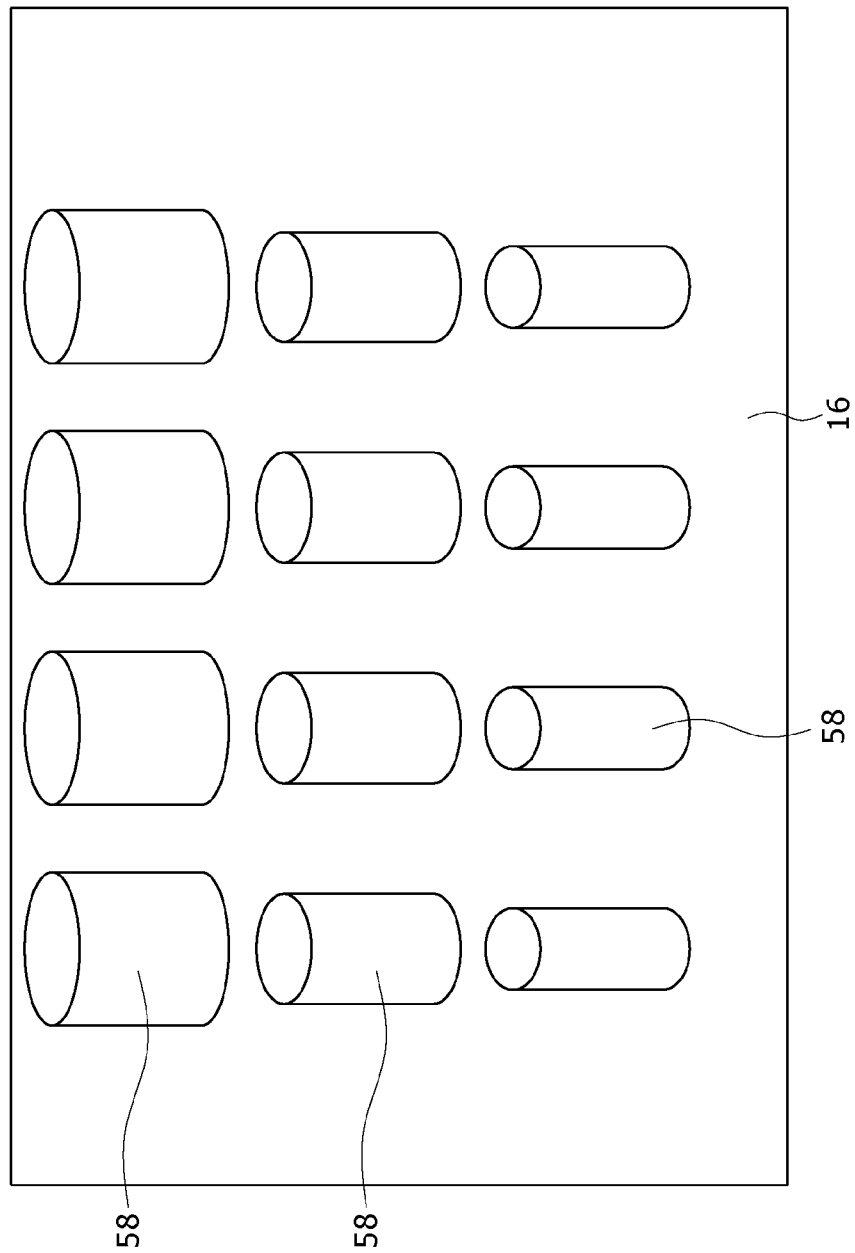

METHOD OF MANUFACTURING SEMICONDUCTOR DEVICE, SEMICONDUCTOR LASER, OPTICAL PICKUP, AND OPTICAL DISK DEVICE WITH NITRIDE TYPE GROUP III-V COMPOUND SEMICONDUCTOR LAYER

CROSS REFERENCES TO RELATED APPLICATIONS

The application is based upon and claims the benefit of priority from the prior Japanese Patent Application JP 2007-050461 filed with the Japanese Patent Office on Feb. 28, 2007, the disclosure of which is hereby incorporated herein by reference in its entirety.

BACKGROUND OF THE INVENTION

1. Field of the Invention

The present invention relates to a method of manufacturing a semiconductor laser, a semiconductor laser, an optical pickup, an optical disk device, a method of manufacturing a semiconductor device, and a method of growing a nitride type Group III-V compound semiconductor layer, and is preferable when applied, for example, to a ridge stripe type semiconductor laser having an end face window structure using a nitride type Group III-V compound semiconductor, and an optical pickup and an optical disk device which use the semiconductor laser as or in a light source.

2. Description of the Related Art

In order to increase the maximum optical output of a semiconductor laser, it may inevitably be necessary to introduce an end face window structure in which an end face of a resonator is provided with a window transparent to the light coming from an active layer.

In a GaInP red light emitting semiconductor laser according to the related art, a method has been effective in which after the growth of a semiconductor layer forming a laser structure, Zn atoms are diffused into the semiconductor layer in the vicinity of a part to be a resonator end face so as to locally increase the band gap energy, thereby forming an end face window structure (refer to, for example, Japanese Patent Laid-open No. 2005-45009).

On the other hand, in recent years, semiconductor lasers based on a nitride type Group III-V compound semiconductor have been used as light sources in high-density optical disk devices and the like. Most of the nitride type Group III-V compound semiconductors are materials which are thermally and mechanically stabler than GaInP semiconductors. Therefore, in the semiconductor laser based on a nitride type Group III-V compound semiconductor, it is difficult to achieve formation of an end face window structure by diffusion of different kinds of atoms and wet etching, which have been effective in the case of the GaInP red light emitting semiconductor laser.

In view of this, with regard to the semiconductor lasers based on a nitride type Group III-V compound semiconductor, a variety of methods for forming an end face window structure have been proposed and put to experiment. Now, methods of forming an end face window structure which have been proposed will be described as follows.

It has been proposed to form an end face window structure through increasing the band gap energy in the vicinity of an end face of a resonator by utilizing an In elimination process caused by irradiation with laser light or exposure to a $H_2$ plasma after the formation of a laser bar by cleavage (refer to, for example, Japanese Patent Laid-open No. 2006-147814 and Japanese Patent Laid-open No. 2006-147815). However, for carrying out these methods, a high-vacuum chamber equipment may be needed, leading to a large-scale plant and equipment investment. Besides, processing the resonator end face after cleavage will generally leave a problem as to productivity.

Many proposals have been made regarding a method in which after a semiconductor layer for forming a laser structure is epitaxially grown on a substrate, a part of the semiconductor layer which is to be a resonator end face is dug by reactive ion etching (RIE), and a nitride type Group III-V compound semiconductor layer with a high band gap energy is again epitaxially grown in the dug area (refer to, for example, Japanese Patent Laid-open No. 2004-134555, Japanese Patent Laid-open No. 2003-60298, International Publication No. 03/036771 pamphlet, and Japanese Patent Laid-open No. 2002-204036). According to this method, however, a surface level would be formed at the surface dug by RIE, leading to the fear that light absorption and local heat generation may occur at the time of laser operation.

As another example, a method has been proposed in which a semiconductor layer for forming a laser structure is epitaxially grown on a substrate provided with a geometric step by RIE or insulating film deposition, whereby an end face window structure is formed (refer to, for example, Japanese Patent Laid-open No. 2005-191588, Japanese Patent Laid-open No. 2005-294394, Japanese Patent Laid-open No. 2003-198057, and Japanese Patent Laid-open No. 2000-196188). This method aims at a phenomenon in which a clad layer higher in band gap energy than an active layer functions as an end face window structure, in the traveling direction of laser light. A typical example of this is shown in FIG. 42. As shown in FIG. 42, in this semiconductor laser, one principal surface of a substrate 101 is patterned by RIE to provide a recess 101a, then an n-type semiconductor layer 102, an active layer 103 and a p-type semiconductor layer 104 are sequentially grown over the recess 101a, and thereafter a p-side electrode 105, an isolation electrode 106 and a pad electrode 107 are formed over the p-type semiconductor layer 104. In other words, steep geometric steps are generated in the n-type semiconductor layer 102, the active layer 103 and the p-type semiconductor layer 104 due to the presence of the recess 101a in the substrate 101, so that an optical waveguide loss would be generated in the vicinity of the steps. Besides, transparency acquired by gap widening in the active layer 103 in the vicinity of the resonator end face is not intended and, therefore, the semiconductor structure may fail to function as an effective end face structure.

SUMMARY OF THE INVENTION

As above-mentioned, the methods for forming the end face window structure in a semiconductor laser based on a nitride type Group III-V compound semiconductor in the past had many problems.

Thus, there is a need for a semiconductor laser using a nitride type Group III-V compound semiconductor, and a manufacturing method for the semiconductor laser, such that an end face window structure can be formed extremely easily, the optical waveguide loss can be suppressed, and light absorption and local heat generation at the time of laser operation due to the presence of a surface level can be restrained.

There is also a need for an optical pickup and an optical disk device which use the above-mentioned excellent semiconductor laser as or in a light source.

Furthermore, there is a need for a method of growing a nitride type Group III-V compound semiconductor layer by which it is possible to easily grow a nitride type Group III-V compound semiconductor containing at least In and Ga and having a part where band gap energy varies in at least one direction, and a semiconductor device and a manufacturing method therefor in which the growing method is utilized.

The present inventors made intensive and extensive studies for solving the above-mentioned problems. As a result of the studies, the present inventors have found out that in the case of growing a nitride type Group III-V compound semiconductor layer containing at least In and Ga, such as an InGaN layer, the band gap energy of a desired part of the nitride type Group III-V compound semiconductor layer can be controlled by selecting the width, spacing, shape, position and the like of portions of an insulating film mask, and they have come to make the present invention. The findings made by the present inventors themselves will be described as follows.

The following basic investigating experiments were made.

As shown in FIGS. 1A and 1B, two $SiO_2$ film masks 2 having a stripe shape with a width w were formed on an n-type GaN substrate 1, in parallel to each other with a spacing d therebetween. Here, FIG. 1A is a plan view, and FIG. 1B is a sectional view taken along line B-B of FIG. 1A. Then, as shown in FIGS. 2A and 2B, a GaN semiconductor layer 3 including an n-type AlGaN clad layer 3a, an n-type GaN optical waveguide layer 3b, an active layer 3c having an undoped $Ga_{1-x}In_xN$ (quantum well layer)/$Ga_{1-y}In_yN$ (barrier layer, x>y) multiple quantum well structure, and an undoped InGaN optical waveguide layer 3d, of layers forming a laser structure of a GaN semiconductor laser, was epitaxially grown over the n-type GaN substrate 1 provided with the $SiO_2$ film masks 2. Here, the growth temperatures of the n-type AlGaN clad layer 3a and the n-type GaN optical waveguide layer 3b which are In-free layers were set in the range of 900 to 1100° C. for example; on the other hand, the growth temperatures of the active layer 3c having the $Ga_{1-x}In_xN/Ga_{1-y}In_yN$ multiple quantum well structure and the undoped InGaN optical waveguide layer 3d which are In-containing layers were set in the range of 700 to 800° C., for example. In this case, the GaN semiconductor layer 3 is not substantially grown on the $SiO_2$ film masks 2, and is grown only on the part, not covered with the $SiO_2$ film masks 2, of the n-type GaN substrate 1.

A specimen thus produced was irradiated with excitation light (hν), and the peak energy of the light emitted from the active layer 3c was evaluated by a microphotoluminescence method (see FIG. 2B). As a result, fundamental data on the dependency of the peak energy of emission from the active layer 3c on the width w and spacing d of the $SiO_2$ film masks 2 could be obtained. The measurement results are shown in FIGS. 3 and 4.

In the graph shown in FIG. 3, $\Delta\lambda_b$ taken on the axis of ordinates is defined as follows. The wavelength corresponding to the peak energy of emission from the active layer 3c at a flat portion of the GaN semiconductor layer 3 formed at a position sufficiently far from the $SiO_2$ film mask 2 is represented by $\lambda_1$. In this case, as one goes away from the $SiO_2$ film mask 2, the wavelength corresponding to the emission peak energy is once shifted to the shorter wavelength side, and is again shifted to the longer wavelength side. The shortest wavelength corresponding to a maximum value of the emission peak energy is represented by $\lambda_{min}$. In this instance, a definition of $\Delta\lambda_b = \lambda_{min} - \lambda_1$ is adopted.

FIG. 3 shows the variation in $\Delta\lambda_b$ with variation in the spacing d, with the width w of the $SiO_2$ film masks 2 being kept constant. The width w was set at each of three levels of 5, 30, and 50 µm. As seen from FIG. 3, in general, $\Delta\lambda_b$ tends to increase in the minus direction as the spacing d is larger and as the width w is larger. For example, where the width w was 5 µm and the spacing d was 10 µm, a $\Delta\lambda_b$ value of about −9 nm was obtained. The $\Delta\lambda_b$ value of about −9 nm corresponds to an increase of about 80 meV in band gap energy. This variation in the band gap energy is sufficient as a value of the end face window structure.

In the graph shown in FIG. 4, $\Delta\lambda_c$ taken on the axis of ordinates is defined as follows. The wavelength corresponding to the peak energy of emission from a central part of the active layer 3c of a GaN semiconductor layer 3 grown in an area between the $SiO_2$ film masks 2 is represented by $\lambda_2$. In this case, a definition of $\Delta\lambda_c = \lambda_2 - \lambda_1$ is adopted.

FIG. 4 shows the variation in $\Delta\lambda_c$ with variation in the spacing d, with the width w of the $SiO_2$ film mask 2 being kept constant. The width w was set to each of three levels of 5, 30 and 50 µm. As seen from FIG. 4, $\Delta\lambda_c$ is shifted in the minus direction in the case where the width w is not less than 30 µm; where the width w is 5 µm, the $\Delta\lambda_c$ tends to be shifted in the plus direction when the spacing d is not more than 5 µm but to be shifted in the minus direction when the spacing d is 10 to 50 µm. For example, a $\Delta\lambda_c$ value of about +5 nm was obtained where the width w was 5 µm and the spacing d was 3 µm, and a $\Delta\lambda_c$ value of about −5 nm was obtained where the width w was 5 µm and the spacing d was 20 µm.

It is seen from the data shown in FIG. 3 that shift of the emission wavelength to the shorter wavelength side (increase in band gap energy of the active layer 3c) can be expected when only a single $SiO_2$ film mask 2 is used. Further, as seen from FIG. 4, surprisingly, it is possible to achieve $\Delta\lambda_c > 0$, namely, to shift the emission wavelength to the longer wavelength side (decrease in band gap energy of the active layer 3c). From these it is understood that the band gap energy of the active layer 3c can be freely varied by arbitrary designing of the pattern of the $SiO_2$ film mask 2.

The present inventors came to a conclusion that the reason why the band gap energy of the active layer 3c can be varied according to the portion of the GaN semiconductor layer 3 in the case where the GaN semiconductor layer 3 is epitaxially grown by use of the $SiO_2$ film mask 2 as above-mentioned lies in that the In diffusion length is very small as compared with the Ga diffusion length. Now, this reasoning will be described.

As shown in FIGS. 2A and 2B, in the case where the active layer 3c of the GaN semiconductor layer 3 is grown over the part, not covered with the $SiO_2$ film mask 2, of the n-type GaN substrate 1, not only In and Ga are supplied to the part directly from the growth material sources but also In and Ga are supplied to the part through a diffusion process in which In and Ga supplied onto the $SiO_2$ film mask 2 are diffused over the $SiO_2$ film mask 2.

FIGS. 5A, 5B and 5C show variations in the concentrations of Ga and In diffused from an edge of the $SiO_2$ mask 2 formed on the n-type GaN substrate 1 toward the outside and variation in In content of the active layer 3c, plotted against the distance measured from the edge along the direction orthogonal to the $SiO_2$ film mask 2. As shown in FIGS. 5A and 5B, where the In diffusion length is very small as compared with the Ga diffusion length, the In concentration becomes constant starting from a short distance $\Delta X1$, whereas the Ga concentration becomes constant starting from a long distance $\Delta X2$. Reflecting these, the In content of the active layer 3c decreases to the distance $\Delta X1$, to once take a minimum value, and then increases again, to become constant starting from the distance $\Delta X2$. The distances $\Delta X1$ and $\Delta X2$ increase respectively with increases in the concentrations of Ga and In being diffused.

FIG. 6 shows the results of measurement of variations in ΔX1 and ΔX2 with the width w in the case where the spacing d between the SiO$_2$ film masks 2 was fixed to 5 μm. Besides, FIG. 7 shows the results of measurement of variations in ΔX1 and ΔX2 with the spacing d in the case where the width w of the SiO$_2$ film masks 2 was fixed to 5 μm. It is seen from FIGS. 6 and 7 that where the width w is 3 to 5 μm, at the growth temperature of the active layer 3c, the maximum Ga diffusion length is about 20 μm, whereas the maximum In diffusion length is no more than about 3 μm, which is smaller than the maximum Ga diffusion length by a factor of about one order of magnitude. From this it is considered that in the case where the width w is 3 to 5 μm, even when the spacing d is enlarged to about 40 μm, it is possible to reduce the In content of the active layer 3c in a central area between the SiO$_2$ film masks 2 and to enlarge the band gap energy thereof.

While the case where the SiO$_2$ film mask 2 is used has been described above, the same control of the In content and band gap energy of the active layer 3c as above can be achieved even with the use of a mask formed of other insulating film such as a SiN film and an Al$_2$O$_3$ film. In addition, the In content and band gap energy can be similarly controlled, not only for the active layer but also for any nitride type Group III-V compound semiconductor layer that contains In and Ga.

As a result of further investigations made by the present inventors based on the above-mentioned studies, the present invention has been completed.

According to an embodiment of the present invention, there is provided a method of manufacturing a semiconductor laser. The method of manufacturing the laser has an end face window structure, by growing over a substrate a nitride type Group III-V compound semiconductor layer including an active layer including a nitride type Group III-V compound semiconductor containing at least In and Ga, the method including the steps of: forming a mask and growing the nitride type Group III-V compound semiconductor layer. The forming mask step includes an insulating film over the substrate, at least in the vicinity of the position of forming the end face window structure. The growing the nitride type Group III-V compound semiconductor layer step includes the active layer over a part, not covered with the mask, of the substrate.

According to the embodiment of the present invention, there is provided a semiconductor laser having an end face window structure which has, over a substrate, a nitride type Group III-V compound semiconductor layer including an active layer including a nitride type Group III-V compound semiconductor containing at least In and Ga. A mask including an insulating film is formed over the substrate, at least in the vicinity of a part corresponding to the end face window structure. The nitride type Group III-V compound semiconductor layer including the active layer is formed over a part, not covered with the mask, of the substrate.

According to the embodiment of the present invention, there is provided an optical pickup using a semiconductor laser as or in a light source. The semiconductor laser has an end face window structure having, on a substrate, a nitride type Group III-V compound semiconductor layer including an active layer including a nitride type Group III-V compound semiconductor containing at least In and Ga. A mask including an insulating film is formed over the substrate, at least in the vicinity of a part corresponding to the end face window structure. The nitride type Group III-V compound semiconductor layer including the active layer is formed over a part, not covered with the mask, of the substrate According to the embodiment of the present invention, there is provided an optical disk device using a semiconductor laser as or in a light source. The semiconductor laser has an end face window structure having, on a substrate, a nitride type Group III-V compound semiconductor layer including an active layer including a nitride type Group III-V compound semiconductor containing at least In and Ga. A mask including an insulating film is formed over the substrate, at least in the vicinity of a part corresponding to the end face window structure. The nitride type Group III-V compound semiconductor layer including the active layer is formed over a part, not covered with the mask, of the substrate.

In the embodiments of the present invention, the width, spacing, shape, position and the like of the mask are appropriately determined according to the characteristics demanded of a semiconductor laser and the like factors, based on at least the above-mentioned findings made by the present inventors. The mask can be formed from any of various insulating films such as SiO$_2$ film, SiN film and Al$_2$O$_3$ film. In an example of formation of the mask, a mask is formed over a substrate in the vicinity of the position of forming an end face window structure and on either one or both sides of the position of forming a laser stripe. The plan-view shape of the mask may be, but is not limited to, a trapezoid, a rectangle or the like. Alternatively, a configuration may be adopted in which a mask is formed over a substrate on one side of the position of forming a laser stripe along the position of forming the laser stripe, in such a manner that the spacing between the position of forming the laser stripe and the mask will be smaller, or larger, in the vicinity of the position of forming an end face window structure than in other areas. Or, a configuration may be adopted in which masks are formed over a substrate on both sides of the position of forming a laser stripe along the position of forming the laser stripe, in such a manner that the spacing between the masks on both sides of the position of forming the laser stripe will be larger in the vicinity of the position of forming an end face window structure than in other areas. In general, the width $W_1$ of the masks is selected to be smaller than the spacing $W_2$ between the masks, but this configuration is not limitative. In the case of forming the masks on both sides of the position of forming the laser stripe, generally, the relationships among the mask width $W_3$ and the mask spacing $W_4$ in the vicinity of the center of the resonator and the mask width $W_5$ and the mask spacing $W_6$ in the vicinity of the position of forming the end face window structure are so set as to satisfy $W_3<W_4$ and $W_5<W_6$, but this design is not limitative. When a nitride type Group III-V compound semiconductor layer including an active layer is grown by use of these masks, the relationship between the In content x (or emission wavelength λ) of the active layer of the laser stripe in an area between the masks or in the vicinity of the masks and the In content y (emission wavelength λ') of the active layer of the laser stripe in a mask-free area can be so set as to satisfy x<y (λ<λ'). In addition, the relationship between the thickness $t_1$ of the laser stripe in an area between the masks and the thickness $t_2$ of the laser stripe in a mask-free area can be so set as to satisfy $t_2<t_1$.

The nitride type Group III-V compound semiconductor includes most generally $Al_xB_yGa_{1-x-y-z}In_zAs_uN_{1-u-v}P_v$ (where $0≦x≦1$, $0≦y≦1$, $0≦z≦1$, $0≦u≦1$, $0≦v≦1$, $0≦x+y+z<1$, $0≦u+v<1$), specifically $Al_xB_yGa_{1-x-y-z}In_zN$ (where $0≦x≦1$, $0≦y≦1$, $0≦z≦1$, $0≦x+y+z<1$), typically $Al_xGa_{1-x-z}In_zN$ (where $0≦x≦1$, $0≦z≦1$), and specific non-limitative examples thereof include GaN, InN, AlN, AlGaN, InGaN, and AlGaInN. The nitride type Group III-V compound semiconductor containing at least In and Ga includes most generally $Al_xB_yGa_{1-x-y-z}In_zAs_uN_{1-u-v}P_v$ (where $0≦x≦1$, $0≦y≦1$, $0≦z≦1$, $0≦u≦1$, $0≦v≦1$, $0≦x+y+z<1$, $0≦u+v<1$), typically $Al_xGa_{1-x-z}In_zN$ (where $0≦x≦1$, $0≦z≦1$), and specific non-limitative examples thereof include InGaN, and AlGaInN. The nitride type Group III-V compound semiconductor layer can typically be grown by various epitaxial growth methods such as metal organic chemical vapor deposition (MOCVD), hydride vapor phase epitaxy or halide vapor phase epitaxy (HVPE), and molecular beam epitaxy (MBE), which are not limitative. As the substrate, a conductive semiconductor substrate, particularly a nitride type Group III-V compound semiconductor substrate (most typically a GaN substrate) is preferably used. However, an insulating substrate such as a sapphire substrate may also be used; further, one of these substrates which has grown thereon at least one nitride type Group III-V compound semiconductor layer may also be used.

The optical disk device includes all of those for exclusive use for reproduction (reading), those for exclusive use for recording (writing), and those capable of both reproduction and recording, and the system of reproduction and/or recording is not particularly limited. The optical pickup includes those which are suited to use in these optical disk devices.

According to the embodiment of the present invention, there is provided a method of manufacturing a semiconductor device by growing over a substrate a nitride type Group III-V compound semiconductor layer containing at least In and Ga, the semiconductor layer having a part where band gap energy varies in at least one direction along a surface of the substrate, the method including the steps of: forming a mask including an insulating film over the substrate in the vicinity of the part where band gap energy varies; and growing the nitride type Group III-V compound semiconductor layer over a part, not covered with the mask, of the substrate.

According to the embodiment of the present invention, there is provided a semiconductor device having a nitride type Group III-V compound semiconductor layer containing at least In and Ga, the semiconductor layer having a part where band gap energy varies in at least one direction along a surface of the substrate. A mask including an insulating film is formed over the substrate in the vicinity of the part where band gap energy varies. The nitride type Group III-V compound semiconductor layer is formed over a part, not covered with the mask pattern, of the substrate.

In the embodiments of the present invention, the semiconductor device includes not only semiconductor light emitting devices such as semiconductor lasers and light emitting diodes but also other various semiconductor devices such as FETs and electron transit devices, and the configuration of the nitride type Group III-V compound semiconductor layer is appropriately designed according to the relevant one of these devices.

The semiconductor laser may be a vertical cavity surface emitting laser (VCSEL). For example, in the case of manufacturing a surface emitting semiconductor laser of the structure in which an active layer including a nitride type Group III-V compound semiconductor containing at least In and Ga is provided between a first reflective layer and a second reflective layer, the active layer may be grown by a method which includes an insulating film having a circular opening, for example, is preliminarily formed on a surface of a layer under the active layer and then the active layer is grown thereon, whereby a configuration can be obtained in which the In content and the refractive index in the portion in the vicinity of an edge of the circular opening are gradually reduced as one goes away from the edge and then the In content and the refractive index are gradually enhanced as one goes toward a central portion. Therefore, in this surface emitting semiconductor laser, a reduction in operating current can be promised, since light is easily concentrated into a central area of the circular opening in the mask including the insulating film at the time of operation. As each of the first reflective layer and the second reflective layer, a distributed Bragg reflector (DBR) is normally used.

Or, in the case of picking up output light through, for example, the second reflective layer in the above-mentioned surface emitting semiconductor laser, the nitride type Group III-V compound semiconductor layer containing at least In and Ga may be used for a light outgoing part of the second reflective layer, whereby a lens part having a desired refractive index distribution can be formed in the nitride type Group III-V compound semiconductor layer. Specifically, the nitride type Group III-V compound semiconductor layer may be grown by a method in which a mask including an insulating film having a circular opening, for example, is preliminarily formed on a surface of a layer under the nitride type Group III-V compound semiconductor layer and the nitride type Group III-V compound semiconductor layer is grown thereon, whereby a configuration can be obtained in which the In content and the refractive index in a portion in the vicinity of an edge of the circular opening are gradually reduced as one goes away from the edge and then the In content and the refractive index are gradually enhanced as one goes toward a central portion, in the same manner as in the foregoing. As a result, a circular convex lens can be formed in the inside of the opening in the mask. When the In content of the nitride type Group III-V compound semiconductor layer constituting the convex lens is set to be lower than the In content of the active layer, the light emitted from the active layer can be prevented from being absorbed by the convex lens.

In the embodiment of the present invention, as for the other items than the just-mentioned, the conditions as described above in relation to the embodiments of the present invention are established unless they are against the desired properties.

According to the embodiment of the present invention, there is provided a method of growing a nitride type Group III-V compound semiconductor laser containing at least In and Ga over a substrate, the semiconductor layer having a part where band gap energy varies in at least one direction along a surface of the substrate, the method including the steps of: forming a mask including an insulating film over the substrate in the vicinity of the part where band gap energy varies; and growing the nitride type Group III-V compound semiconductor layer over a part, not covered with the mask, of the substrate.

This method of growing a nitride type Group III-V compound semiconductor layer can be applied generally to the cases in which a part where band gap energy varies is formed in a nitride type Group III-V compound semiconductor layer containing at least In and Ga. For example, the method can be applied not only to production of such semiconductor devices as semiconductor lasers and light emitting diodes but also to production of optical component parts such as the above-mentioned convex lens and, further, to production of photonic crystals and the like.

In the embodiment of the present invention, as for other items than the just-mentioned, the conditions as described above in relation to the embodiments of the present invention are satisfied unless they are against the desired properties.

In the embodiments of the present invention which are configured as above-described, when the mask including an insulating film is formed over the substrate at least in the vicinity of the position of forming the end face window structure and the active layer is grown over a part, not covered with the mask, of the substrate, it is ensured that the In content of the active layer in the part forming the end face window structure is lower than that in the other part, since the In diffusion length is extremely small as compared with the Ga diffusion length. In this case, formation of a recess in the substrate is not needed to form the end face window structure, and generation of a steep step in the nitride type Group III-V compound semiconductor layer including the active layer can be obviated by appropriately selecting the shape of the mask, so that the optical waveguide loss can be suppressed. In addition, since digging of the semiconductor layer in the portion for forming the end face window structure by RIE is not needed, a surface level is not formed, and it is possible to prevent light absorption or local heat generation from occurring at the time of laser operation.

In the embodiments of the present invention which are configured as above-described, when the mask including an insulating film is formed over the substrate in the vicinity of a portion corresponding to the part where band gap energy varies and the nitride type Group III-V compound semiconductor layer is formed over a part, not covered with the mask, of the substrate, it is ensured that since the In diffusion length is extremely small as compared with the Ga diffusion length, the In content of the nitride type Group III-V compound semiconductor layer in the portion in the vicinity of the mask is varied, and the band gap energy is varied.

According to the present embodiment, it is possible to realize a semiconductor laser using a nitride type Group III-V compound semiconductor wherein an end face window structure can be formed extremely easily, the optical waveguide loss can be suppressed, and it is possible to prevent light absorption or local heat generation from occurring at the time of laser operation. With the excellent semiconductor laser used as or in a light source in an optical pickup, a high-performance optical disk device can be realized.

In addition, according to the present embodiment, it is possible to extremely easily grow a nitride type Group III-V compound semiconductor layer containing at least In and Ga and having a part where band gap energy varies in at least one direction.

BRIEF DESCRIPTION OF THE DRAWINGS

FIGS. 5A, 5B and 5C are schematic diagrams showing distributions of Ga concentration, In concentration and In content when an InGaN layer is grown over the specimen used in the fundamental investigations made by the present inventors;

FIG. 8 is a plan view for illustrating the method of manufacturing a GaN semiconductor laser according to a first embodiment of the present invention;

FIG. 40 is a perspective view for illustrating the method of manufacturing a photonic crystal according to a twelfth embodiment of the present invention;

FIG. 41 is another perspective view for illustrating the method of manufacturing the photonic crystal according to the twelfth embodiment of the present invention.

DETAILED DESCRIPTION OF THE PREFERRED EMBODIMENTS

Figure 1A:
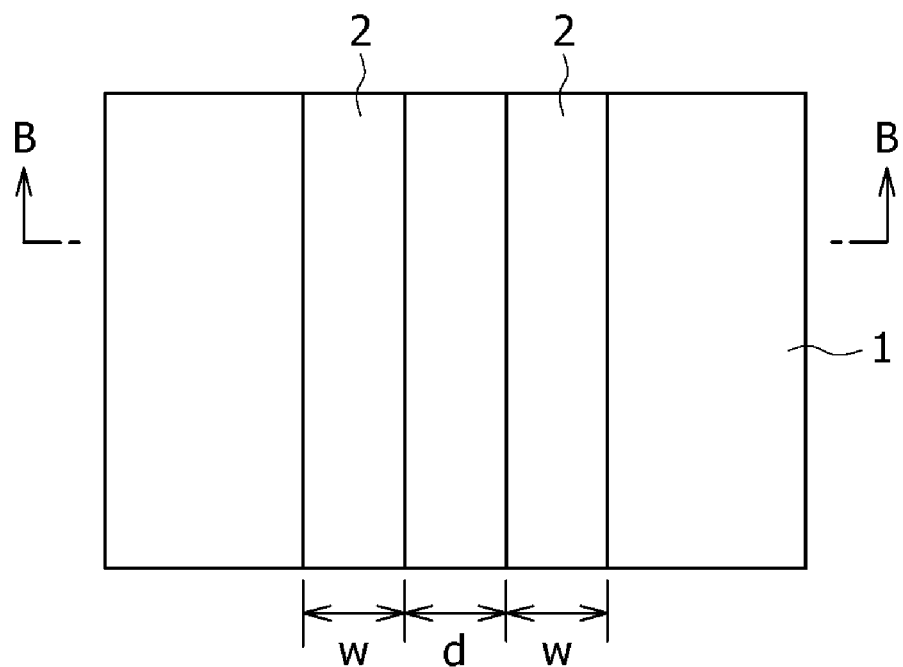
FIGS. 1A and 1B are respectively a plan view and a sectional view which illustrate a specimen used in fundamental investigations made by the present inventors.
Figure 1B:
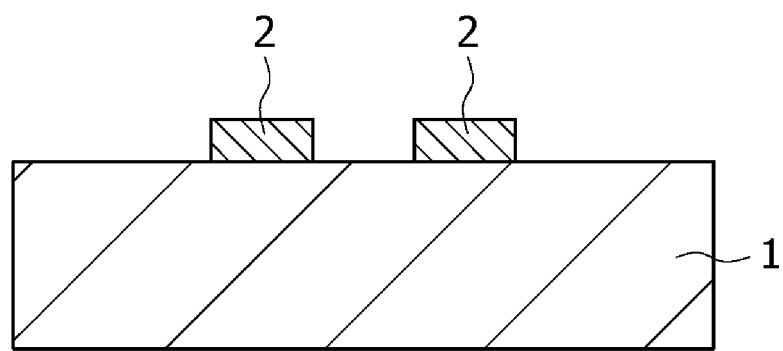
Figure 2A:
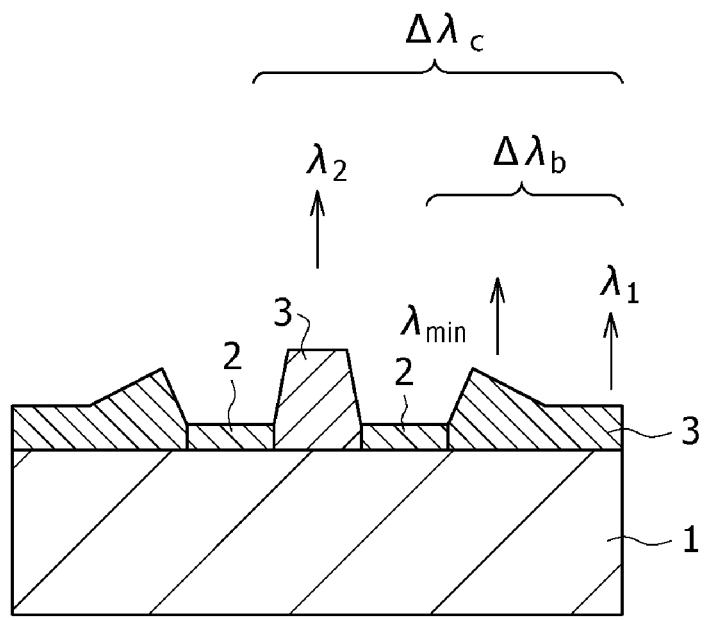
FIGS. 2A and 2B are sectional views illustrating the specimen used in the fundamental investigations made by the present inventors.
Figure 2B:
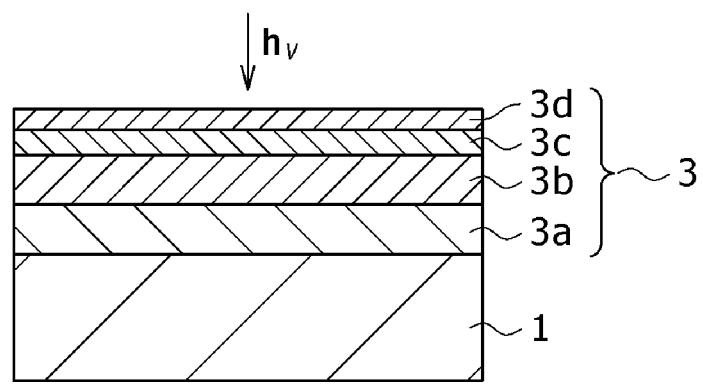
Figure 3:
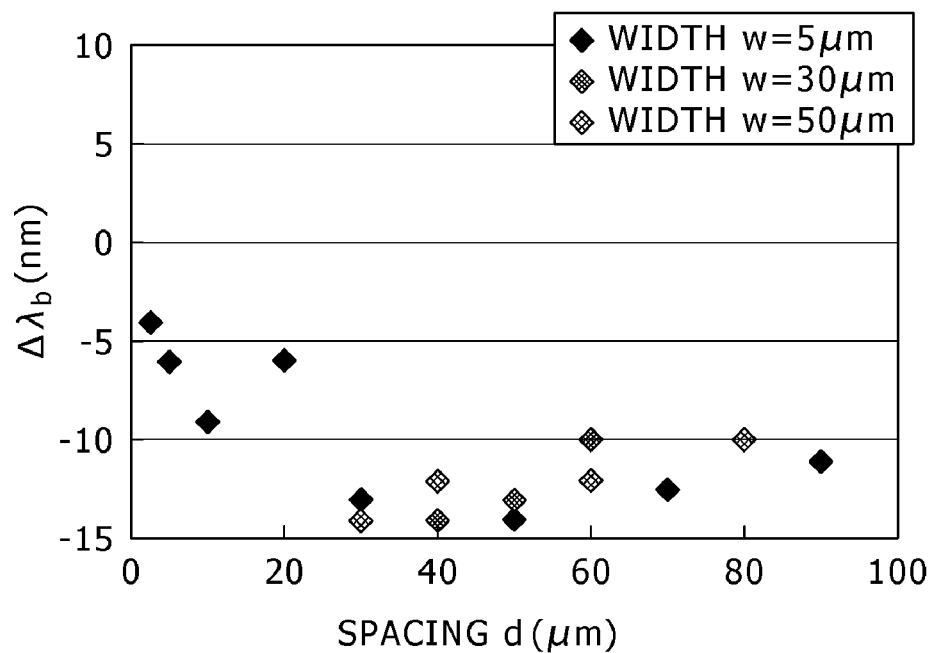
FIG. 3 is a schematic diagram showing the variation in emission wavelength with variations in the width and spacing of $SiO_2$ film masks, in the specimen used in the fundamental investigations made by the present inventors.
Figure 4:
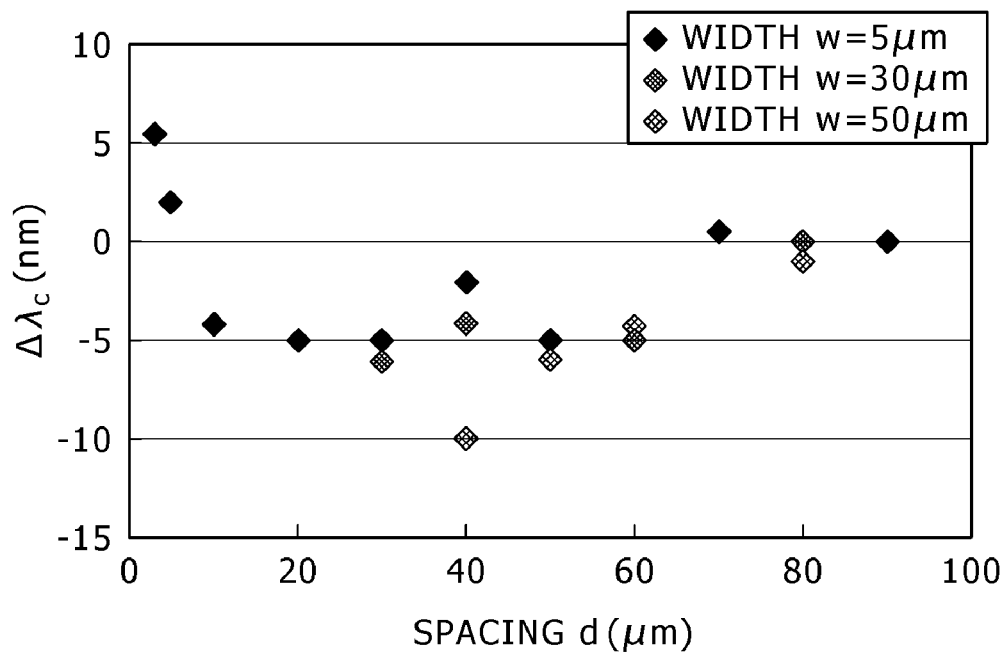
FIG. 4 is another schematic diagram showing the variation in emission wavelength with variations in the width and spacing of the $SiO_2$ film masks, in the specimen used in the fundamental investigations made by the present inventors.
Figure 6:
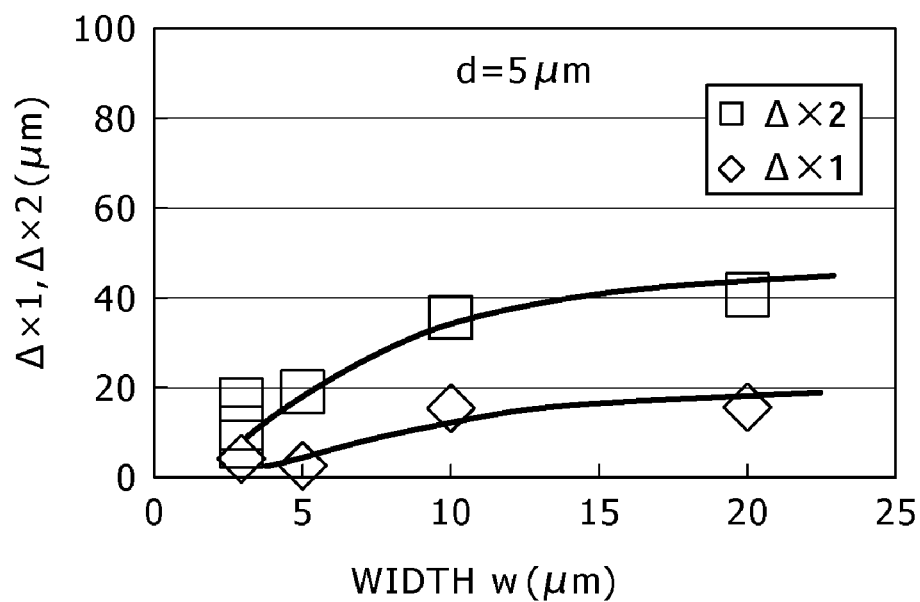
FIG. 6 is a schematic diagram showing the variations in $\Delta X1$ and $\Delta X2$ with variation in the width of the $SiO_2$ film masks, with the spacing between the $SiO_2$ film masks being kept constant, in the specimen used in the fundamental investigations made by the present inventors.
Figure 7:
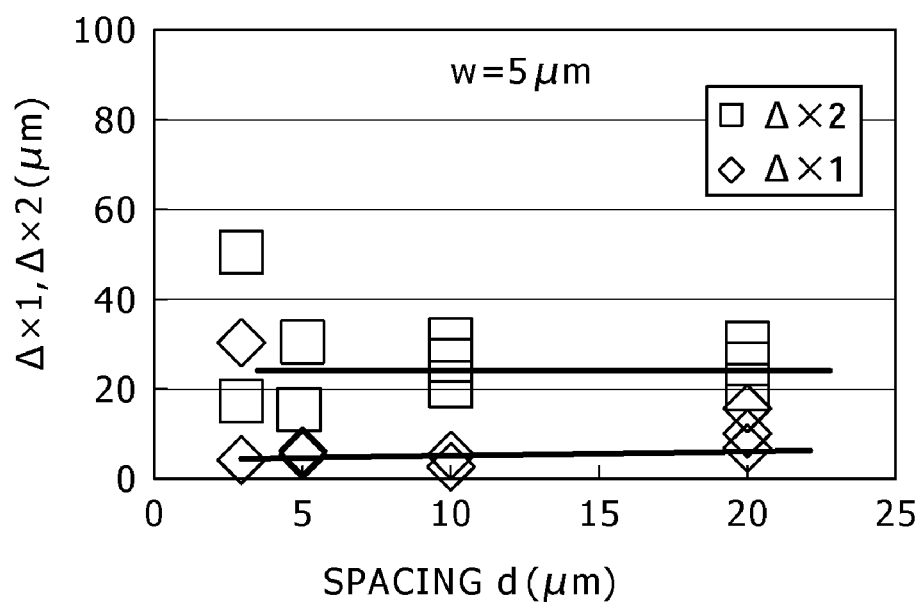
FIG. 7 is a schematic diagram showing the variations in $\Delta X1$ and $\Delta X2$ with variation in the spacing between the $SiO_2$ film masks, with the width of the $SiO_2$ film masks being kept constant, in the specimen used in the fundamental investigations made by the present inventors.

Now, embodiments of the present invention will be described below referring to the drawings. Incidentally, in all the drawings relating to the embodiments, the same or corresponding parts are denoted by the same symbols.

FIGS. 8 to 29 illustrate the method of manufacturing a GaN semiconductor laser according to a first embodiment of the present invention. The GaN semiconductor laser has an end face window structure and a ridge stripe structure, wherein parts, in the vicinity of resonator end faces, of a p-side electrode are removed so that both end parts of the resonator are set as current non-injection region.

Figure 9A:
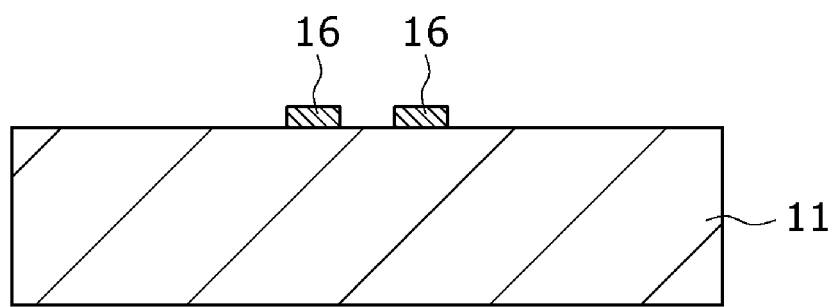
FIGS. 9A and 9B are sectional views for illustrating the method of manufacturing the GaN semiconductor laser according to the first embodiment of the present invention.
Figure 9B:
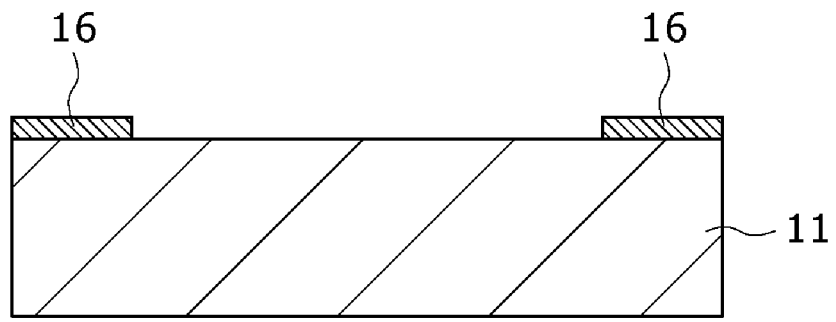

In the first embodiment, first, as shown in FIG. 8 and FIGS. 9A and 9B, a chip region 12 as a region to finally be one laser chip is defined on an n-type GaN substrate 11. Then, in the chip region 12, insulating film masks 16 having a trapezoidal plan-view shape are formed in the vicinity of resonator end face forming positions 13, 14, where front-side and rear-side resonator end faces are to be finally formed by cleavage or the like, and on both sides of a ridge stripe forming position 15 where a ridge stripe is to be formed later, in line symmetry with respect to the ridge stripe forming position 15. Here, FIG. 8 is a plan view, FIG. 9A is a sectional view taken along line A-A of FIG. 8, and FIG. 9B is a sectional view taken along line B-B of FIG. 8. Of the pair of parallel edges of each insulating mask 16, the longer edge is located at one edge of the ridge stripe forming position 15. The insulating film mask 16 has a width $w_1$ at its part within a distance $d_1$ from the resonator end face forming position 13, 14, and has a tapered shape in which the width is linearly reduced from $w_1$ to 0 along the resonator length direction at its part where the distance is in the range of $d_1$ to $d_2$. One non-limitative example of the dimensions is $d_1=20$ μm, $d_2=50$ μm, and $w_1=5$ μm. The insulating film masks 16 may each be composed of an insulating film such as $SiO_2$ film, SiN film, and $Al_2O_3$ film. The insulating film masks 16 can be easily formed, for example, by forming an insulating film on the n-type GaN substrate 1 by vacuum evaporation, CVD or the like, and then patterning the insulating film by etching. The thickness of the insulating film masks 16 is, for example, about 300 nm, which is not limitative. The width of the ridge stripe forming position 15 is determined according to the characteristics demanded of the GaN semiconductor laser and the like factors, and a general but not limitative example of the width is about 1 to 20 μm (or about 1 to 12 μm). While the chip regions 12 in practice are present repeatedly in a matrix pattern on the n-type GaN substrate 11, only one chip region 12 is shown in FIG. 8. In addition, while the insulating masks 16 in practice are formed over two or more adjacent chip regions 12, only the insulating film masks 16 present in one chip region 12 are shown in FIG. 8. The shape and the size of the chip region 12 shown in FIG. 8 are merely non-limitative examples.

Figure 10A:
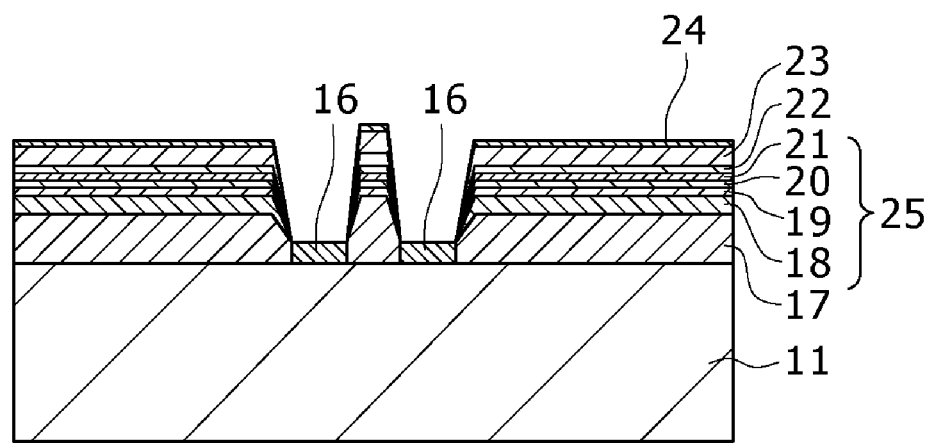
FIGS. 10A and 10B are another sectional views for illustrating the method of manufacturing the GaN semiconductor laser according to the first embodiment of the present invention.
Figure 10B:
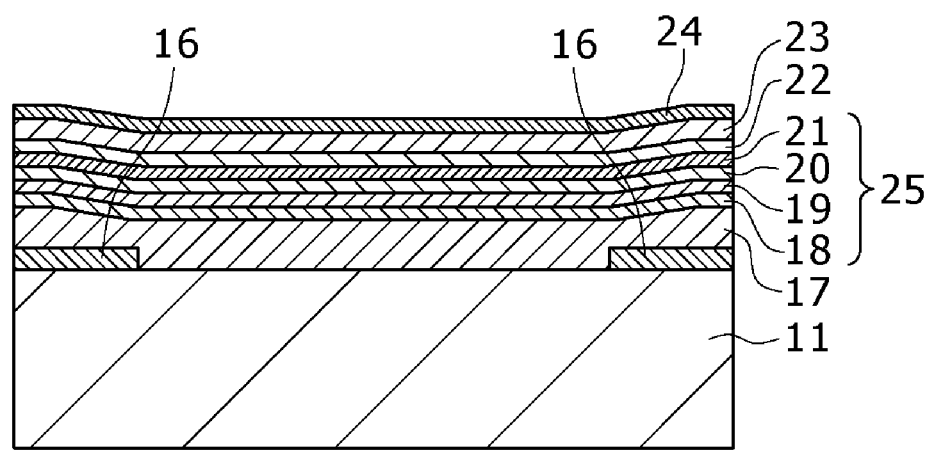

Next, as shown in FIGS. 10A and 10B, GaN semiconductor layers for forming a laser structure are epitaxially grown over the n-type GaN substrate 11 (provided thereon with the insulating film masks 16) by, for example, a metal organic chemical vapor deposition (MOCVD) process. Here, FIG. 10A is a sectional view taken along line A-A of FIG. 8, and FIG. 10B is a sectional view taken along line B-B of FIG. 8. As the GaN semiconductor layers for forming the laser structure, specifically, an n-type AlGaN clad layer 17, an n-type GaN optical waveguide layer 18, an active layer 19 of an undoped $Ga_{1-x}In_xN$ (quantum well layer)/$Ga_{1-y}In_yN$ (barrier layer, x>y) multiple quantum well structure, an undoped InGaN optical waveguide layer 20, an undoped AlGaN optical waveguide layer 21, a p-type AlGaN electron barrier layer 22, a p-type GaN/undoped AlGaN superlattice clad layer 23 and a p-type GaN contact layer 24 are sequentially grown epitaxially. Here, the growth temperatures of the n-type AlGaN clad layer 17, the n-type GaN optical waveguide layer 18, the undoped AlGaN optical waveguide layer 21, the p-type AlGaN electron barrier layer 22, the p-type GaN/undoped AlGaN superlattice clad layer 23 and the p-type GaN contact layer, which are In-free layers, are set in the range of 900 to 1100° C., for example. On the other hand, the growth temperatures of the active layer 19 of the $Ga_{1-x}In_xNGa_{1-y}In_yN$ multiple quantum well structure and the undoped InGaN optical waveguide layer 20, which are In-containing layers, are set in the range of 700 to 800° C., for example. These examples are non-limitative. Incidentally, in the following description, these layers forming the laser structure will be designated collectively as the GaN semiconductor layer 25, as necessary.

The growing raw materials for the GaN semiconductor layers are as follows. Non-limitative examples of raw material for Ga include triethylgallium ($(C_2H_5)_3Ga$, TEG) and trimethylgallium ($(CH_3)_3Ga$, TMG); non-limitative examples of raw material for Al include trimethylaluminum ($(CH_3)_3Al$, TMA); non-limitative examples of raw material for In include triethylindium ($(C_2H_5)_3In$, TEI) and trimethylindium ($(CH_3)_3In$, TMI); and non-limitative examples of raw material for N include ammonia ($NH_3$). As for dopants, non-limitative examples of n-type dopant include silane ($SiH_4$), and non-limitative examples of p-type dopant include bis(methylcyclopentadienyl)magnesium (($CH_3C_5H_4)_2Mg$), bis(ethylcyclopentadienyl)magnesium (($C_2H_5C_5H_4)_2Mg$), and bis(cyclopentadienyl) magnesium (($C_2H_5)_2Mg$). In addition, non-limitative examples of the carrier gas atmosphere used at the time of growing the GaN semiconductor layers include $H_2$ gas. A general but not limitative value of the flow rate ratio (V/III ratio) of the material for the Group V element to the material for the Group III element is in the range of $10^3$ to $10^6$ (for example, about $10^5$). Besides, a non-limitative example of the pressure at the time of the growth is 760 Torr (normal pressure).

In this case, the n-type AlGaN clad layer 17, the n-type GaN optical waveguide layer 18, the active layer 19, the undoped InGaN optical waveguide layer 20, the undoped AlGaN optical waveguide layer 21, the p-type AlGaN electron barrier layer 22, the p-type GaN/undoped AlGaN superlattice clad layer 23 and the p-type GaN contact layer 24 are substantially not grown over the insulating masks 16, but are grown only over the parts, not covered with the insulating masks 16, of the n-type GaN substrate 11. Such a growth can be easily realized by selecting the growing conditions by a known method. In this case, during the growth of the n-type AlGaN clad layer 17, for the growth at the ridge stripe forming position 15 in the area between a pair of the insulating film masks 16, not only the Al atoms and Ga atoms are supplied into this area directly from the growing raw materials, but also the Al atoms and Ga atoms supplied from the growing raw materials onto the insulating film masks 16 on both sides of this area are supplied into this area (to contribute to the growth) through diffusion over the insulating film masks 16. Therefore, the thickness of the n-type AlGaN clad layer 17 in the area between the pair of the insulating film masks 16 is greater than in the other areas. Here, of each of the insulating film masks 16, the part at a distance of $d_1$ to $d_2$ from the resonator end face forming position 13, 14 has a width which is linearly reduced from $w_1$ to 0, so that the quantities of the Al atoms and Ga atoms supplied to the ridge stripe forming position 15 in this area from over the insulating film masks 16 are gradually reduced along the resonator length direction. As a result of this, the thickness of the n-type AlGaN clad layer 17 in this area is gradually increased along the resonator length direction toward the resonator end face forming position 13, 14. On the other hand, of each of the insulating film masks 16, the part within a distance $d_1$ from the resonator end face forming position 13, 14 has a constant width $w_1$, so that the quantities of the Al atoms and Ga atoms supplied from over the insulating masks 16 to the ridge stripe forming position in this area are constant along the resonator length direction. As a result of this, the thickness of the n-type AlGaN clad layer 17 in this area is constant. This applies also to the n-type GaN optical waveguide layer 18.

On the other hand, during the growth of the active layer 19 containing In and Ga, for the growth at the ridge stripe forming position 15 in the area between a pair of the insulating film masks 16, not only the In atoms and Ga atoms are supplied into this area directly from the growing raw materials, but also the In atoms and Ga atoms supplied from the growing raw materials onto the insulating film masks 16 on both sides of this area are supplied into this area (to contribute to the growth) through diffusion over the insulating film masks 16. In this case, since the diffusion length of the In atoms at the growth temperature (e.g., 700 to 800° C.) of the active layer 19 is smaller than the diffusion length of the Ga atoms by a factor of about one order of magnitude, the quantity of the In atoms supplied from over the insulating film masks 16 to the ridge stripe forming position 15 in this area is smaller than that of the Ga atoms. As a result, the In content of the active layer 19 becomes uneven along the resonator length direction; specifically, the In content of the part corresponding to the area between the pair of the insulating film masks 16 becomes lower than that of other part. Therefore, the band gap energy in this part is higher than the band gap energy in other part, and, hence, this part will finally be the region of the end face window structure. This applies also to the growth of the undoped InGaN optical waveguide layer 20.

The growth of each of the undoped AlGaN optical waveguide layer 21, the p-type AlGaN electron barrier layer 22, the p-type GaN/undoped AlGaN superlattice clad layer 23 and the p-type GaN contact layer 24 is similar to that of the n-type AlGaN clad layer 17 and the n-type GaN optical waveguide layer 18.

Figure 11A:
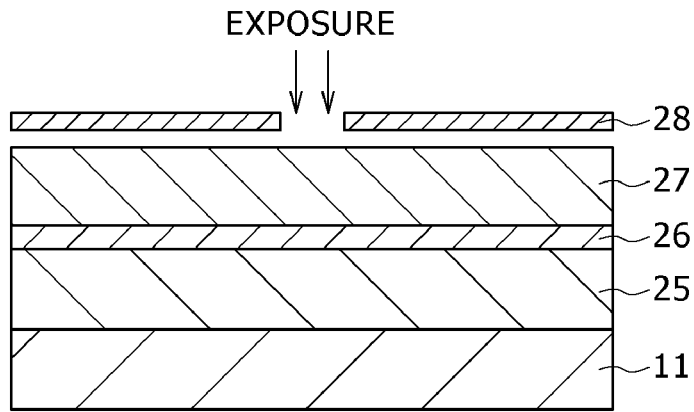
FIGS. 11A, 11B and 11C are still another sectional views for illustrating the method of manufacturing the GaN semiconductor laser according to the first embodiment of the present invention.

Next, as shown in FIG. 11A, an insulating film 26 is formed on the GaN semiconductor layer 25 (the uppermost layer of which is the p-type GaN contact layer 24) forming the laser structure, and then the insulating film 26 is coated with a resist 27. A non-limitative example of the insulating film 26 is a $SiO_2$ film. Subsequently, the resist 27 is exposed by use of a photomask 28 provided with a mask pattern of a predetermined shape.

Figure 11B:
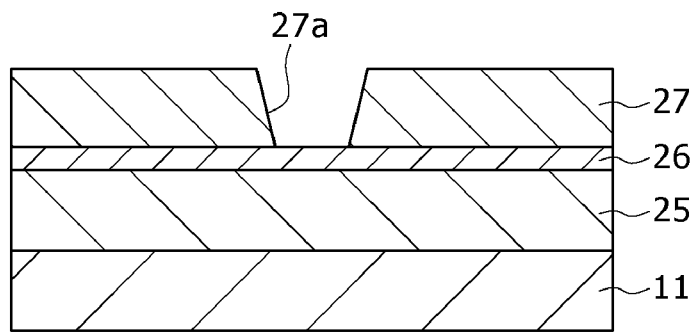
Figure 11C:
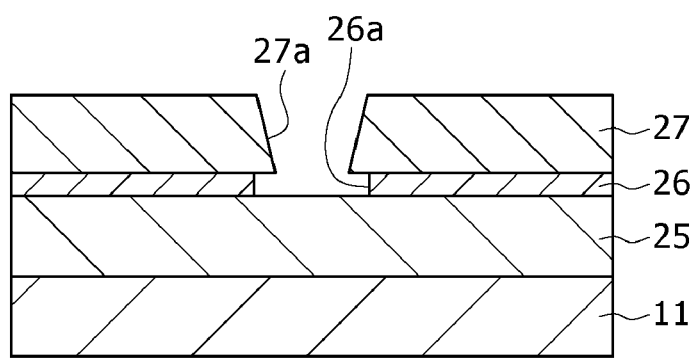

Next, as shown in FIG. 11B, the resist 27 thus selectively exposed is subjected to development, thereby forming an opening 27a. The plan-view shape of the opening 27a is a stripe shape corresponding to the shape of the ridge stripe to be formed later (the same shape as the shape of the ridge stripe forming position 15). In practice, a multiplicity of such openings 27a are formed in parallel at a predetermined pitch, but only one opening 27a is shown here.

Subsequently, as shown in FIG. 1C, the insulating film 26 is etched by using the resist 27 as an etching mask, to form an opening 26a. In the case of using a $SiO_2$ film as the insulating film 26, for example, wet etching may be conducted by use of a hydrofluoric acid etchant, which is not limitative.

Figure 12A:
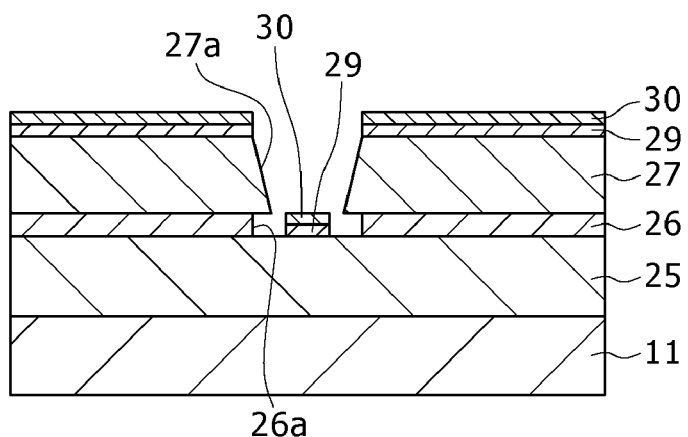
FIGS. 12A, 12B and 12C are still another sectional views for illustrating the method of manufacturing the GaN semiconductor laser according to the first embodiment of the present invention.

Next, as shown in FIG. 12A, with the resist 27 left as it is, a Pd film 29 and a Pt film 30 are sequentially formed by, for example, vacuum evaporation from a direction orthogonal to the surface of the n-type GaN substrate 11. Here, the thickness of the Pt film 30 is so set that the Pt film 30 will be substantially etched away to leave a very small thickness, for example, a thickness of 5 nm or below or a thickness of 3 nm or below, upon completion of dry etching by the RIE process conducted later for forming the ridge stripe. Specifically, for example, the thickness of the Pd film 29 is 150 nm, and the thickness of the Pt film is 30 nm, which values are not limitative.

Figure 12B:
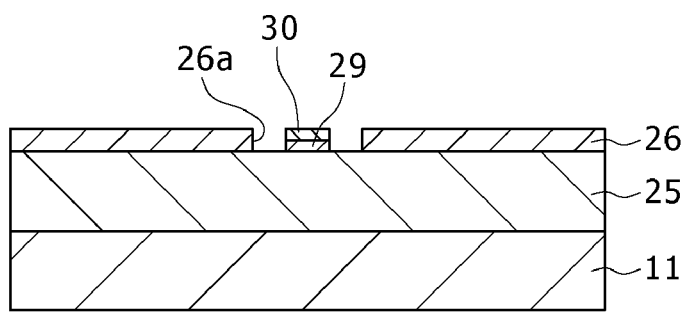

Subsequently, the resist 27 is removed (lifted off) together with the Pd film 29 and the Pt film 30 formed thereon. Thus, as shown in FIG. 12B, the Pd film 29 and the Pt film 30 in the shape of a stripe extending in one direction are formed. The width of the Pd film 29 and the Pt film 30 in the stripe shape is the same as the width of the ridge stripe forming position 15, and is for example 1 to 20 μm, which is not limitative.

Figure 12C:
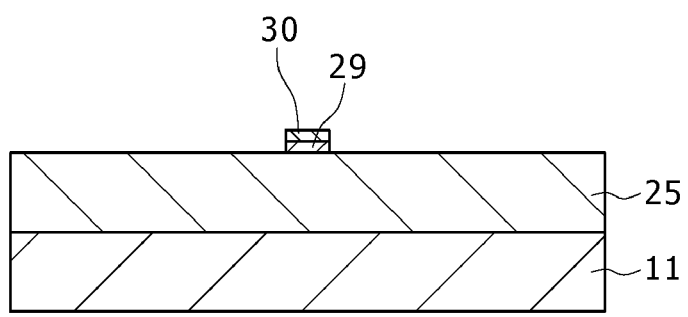
Figure 13:
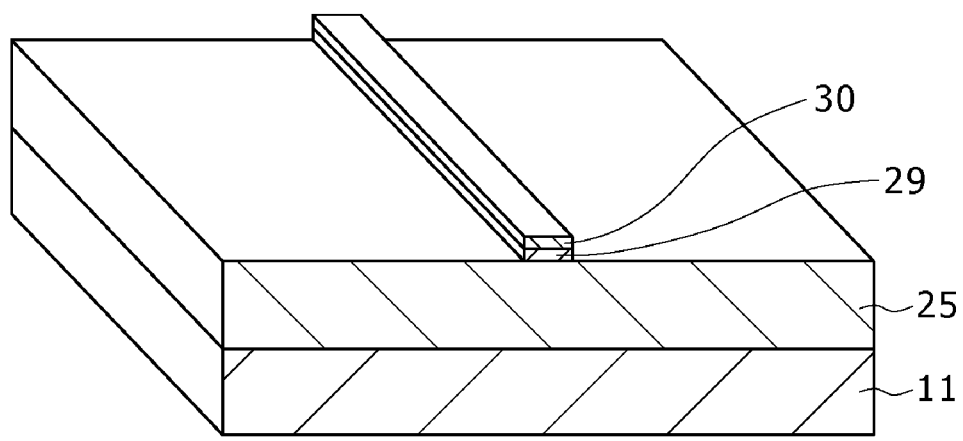
FIG. 13 is a perspective view for illustrating the method of manufacturing the GaN semiconductor laser according to the first embodiment of the present invention.
Figure 14:
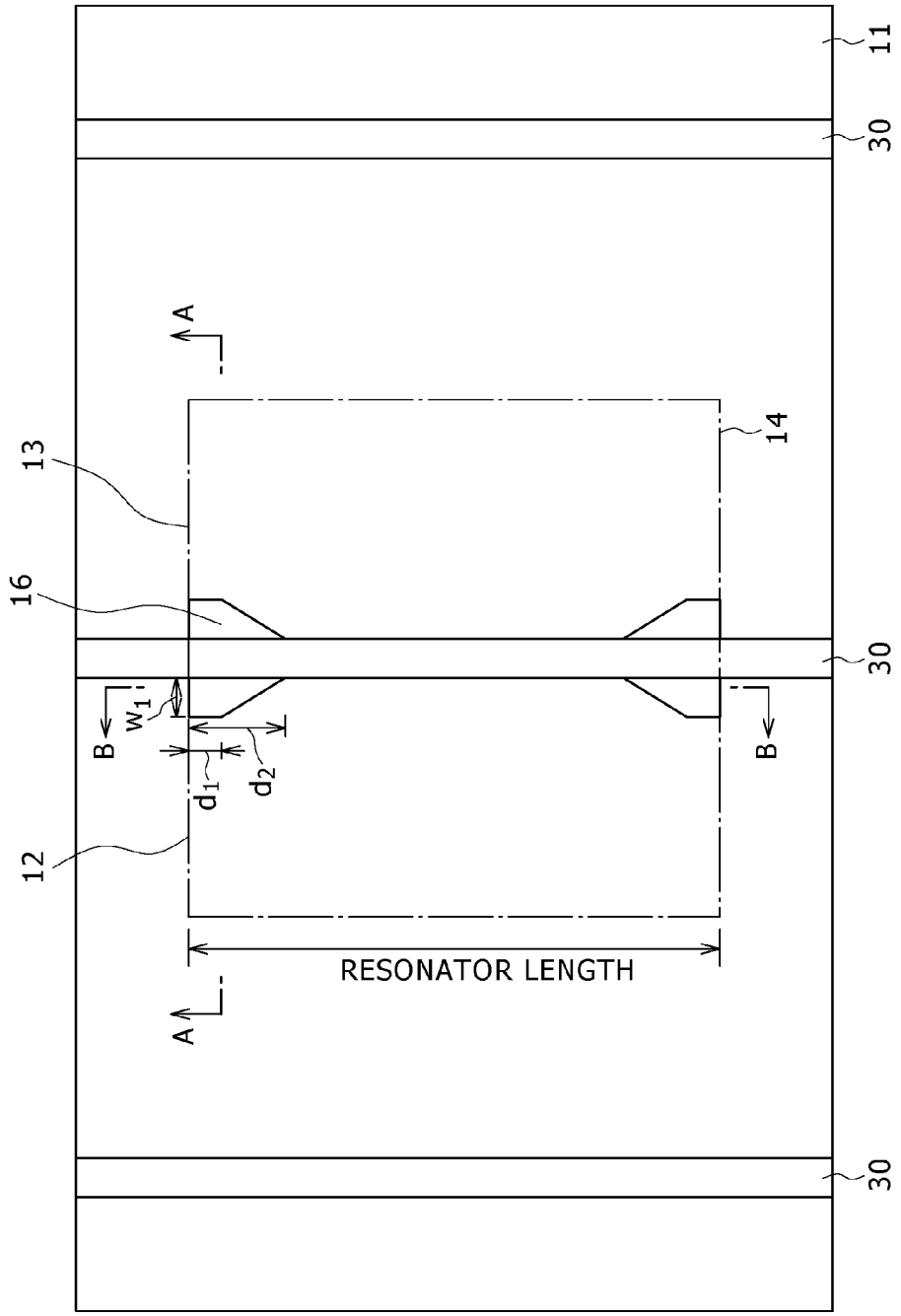
FIG. 14 is another plan view for illustrating the method of manufacturing the GaN semiconductor laser according to the first embodiment of the present invention.

Next, as shown in FIG. 12C, the insulating film 26 is etched away. In the case of using a $SiO_2$ film as the insulating film 26, for example, wet etching is conducted by using a hydrofluoric acid etchant, which is not limitative. FIG. 13 is a perspective view showing this condition, and FIG. 14 is a plan view of this condition.

Figure 15:
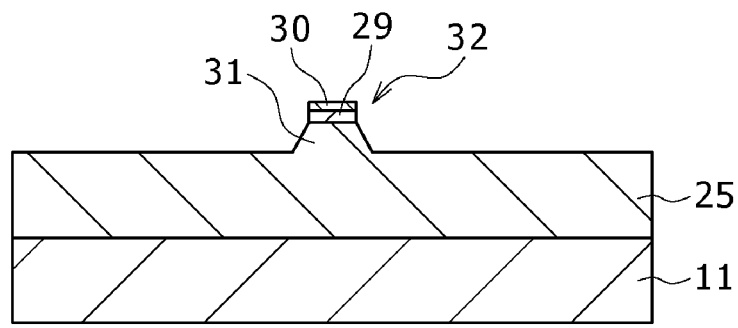
FIG. 15 is still another sectional view for illustrating the method of manufacturing the GaN semiconductor laser according to the first embodiment of the present invention.
Figure 16:
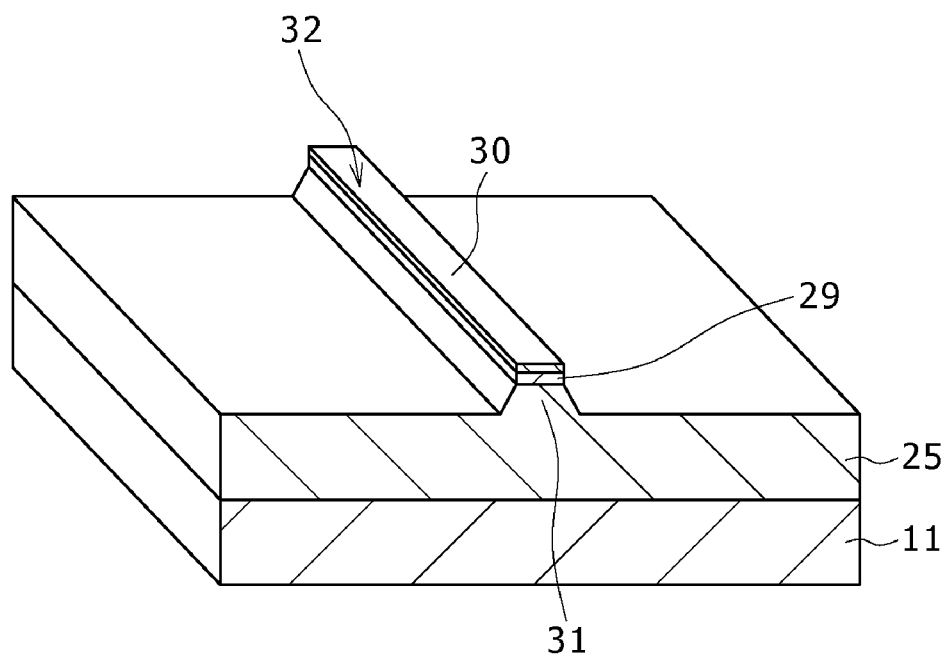
FIG. 16 is another perspective view for illustrating the method of manufacturing the GaN semiconductor laser according to the first embodiment of the present invention.

Subsequently, as shown in FIG. 15, while using the Pd film 29 and the Pt film 30 in the stripe shape as an etching mask, the GaN semiconductor layer 25 is dry etched to a predetermined depth by, for example, the RIE process using a chlorine-based etching gas, to form a ridge stripe 31. In this case, as above-mentioned, the thickness of the Pt film 30 is so set that the Pt film 30 is substantially etched away to leave a very small thickness, for example, a thickness of 5 nm or below or a thickness of 3 nm or below, upon completion of the dry etching; therefore, the Pd film 29 is constantly covered with the Pt film 30 throughout the dry etching. Accordingly, there is no fear that roughening of the etched surface might be caused by deposition of Pd through sputtering of the surface of the Pd film 29 during the dry etching, and that such roughening might cause a trouble in carrying out the subsequent process or might exert bad influences on the reliability of the laser. The etching rates in the RIE process may be, for example, 0.01 μm/min for the Pt film 30, and 0.13 μm/min for the GaN semiconductor layer 25. The height of the ridge stripe 31 is, for example, 0.4 to 0.65 μm, which is not limitative. FIG. 16 is a perspective view showing this condition. The ridge stripe 31 is formed, for example, to an intermediate depth of the p-type GaN/undoped AlGa superlattice clad layer 23 of the GaN semiconductor layer 25. The Pd film 29 and the Pt film 30 thus finally left in the stripe shape constitute a p-side electrode 32.

Figure 17A:
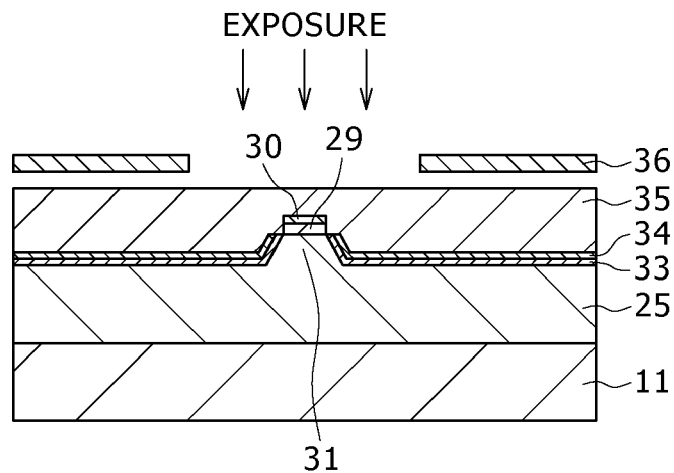
FIGS. 17A, 17B and 17C are still another sectional views for illustrating the method of manufacturing the GaN semiconductor laser according to the first embodiment of the present invention.

Next, as shown in FIG. 17A, an insulating film 33 such as a $SiO_2$ film and an insulating film 34 such as an undoped Si film are sequentially formed over the whole surface, then a resist pattern (not shown) having an opening in the area corresponding to the ridge stripe 31 is formed thereon by lithography, and the portions, over the ridge stripe 31, of the films 33 and 34 are selectively etched away by using the resist pattern as a mask. Thereafter, the resist pattern is removed. Subsequently, the whole surface inclusive of the area of the Pd film 29 and the Pt film 30 is coated with a resist 35, and the resist 35 is exposed by using a photomask 36 provided with a mask pattern in a predetermined shape.

Figure 17B:
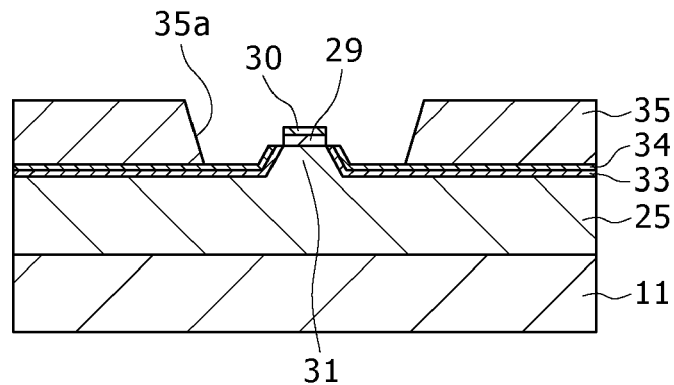
Figure 18:
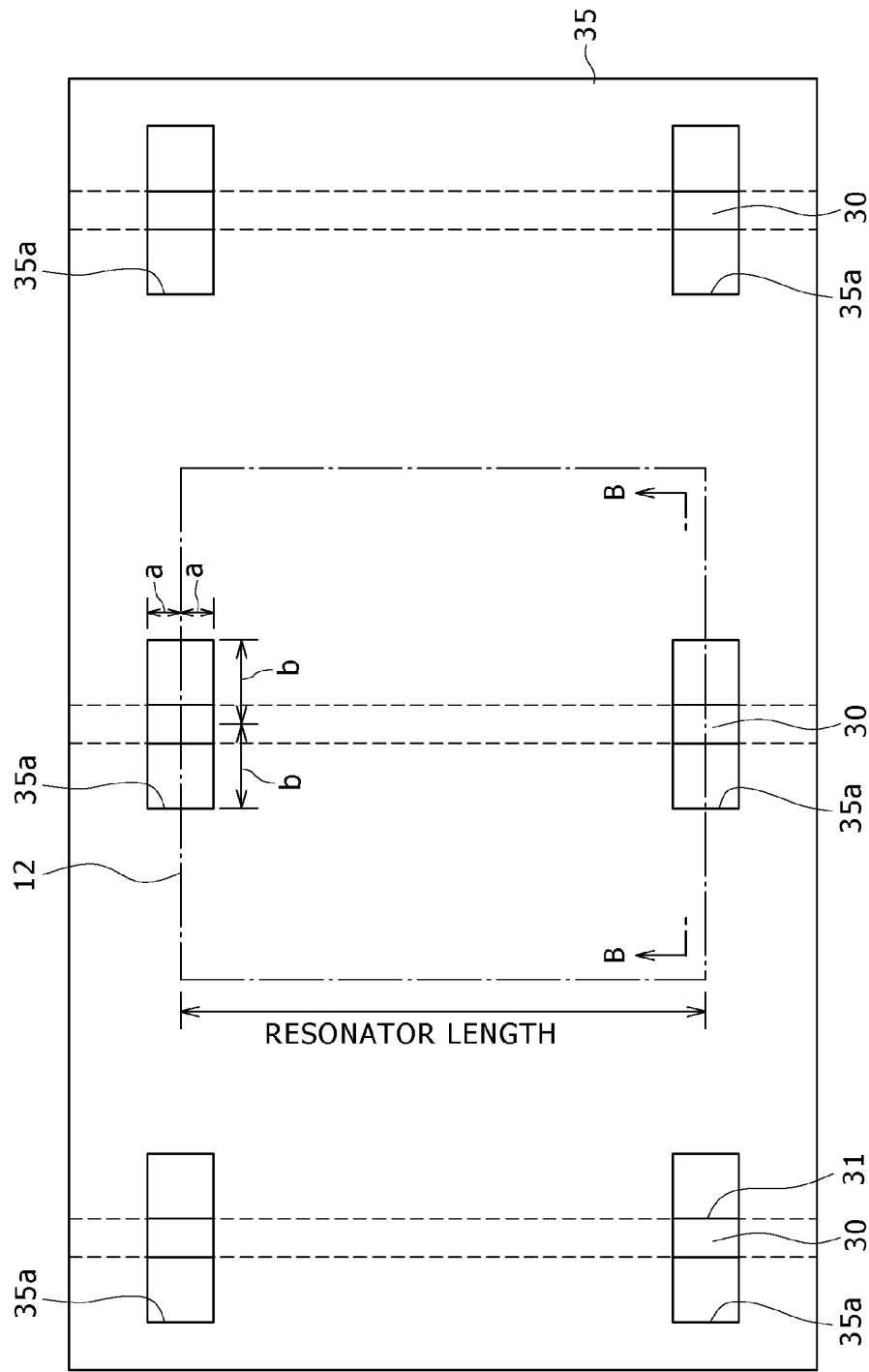
FIG. 18 is still another plan view for illustrating the method of manufacturing the GaN semiconductor laser according to the first embodiment of the present invention.

Next, as shown in FIG. 17B, the thus selectively exposed resist 35 is subjected to development, to form an opening 35a. FIG. 18 is a plan view showing this condition. FIG. 17B corresponds to a sectional view taken along line B-B of FIG. 18. The plan-view shape of the opening 35a is a rectangle having a total width of 2a (a width of a in the resonator length direction on each side of the resonator end face forming position 13, 14) and a total length of 2b (a length of b on each side of the center line of the ridge stripe 31).

Figure 17C:
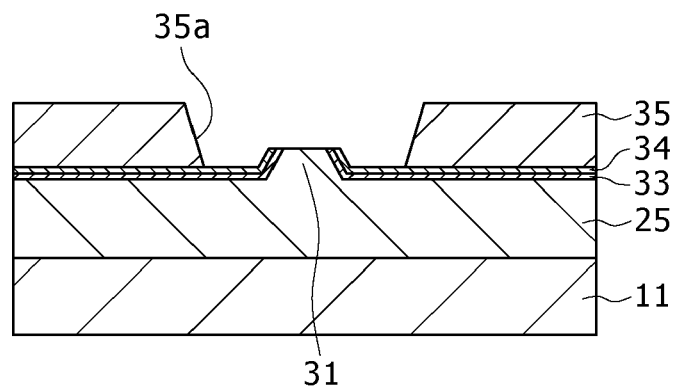

Subsequently, as shown in FIG. 17C, with the resist 35 as an etching mask, wet etching is conducted using aqua regia to etch away the very thinly left Pt film 30 and the Pd film 29. Here, the etching rate of the Pt film 30 by aqua regia is very low as compared with that of the Pd film 29. However, since the Pt film 30 is extremely thin, the Pt film 30 can be etched away in a short time, and thereafter the Pd film 29 can be etched away at a sufficient etching rate. The rate of etching of the Pd film 29 by aqua regia is, for example, about 50 nm/min.

In this manner, the Pd film 29 and the Pt film 30 inside the opening 35a in the resist 35 can be completely etched away.

Figure 19A:
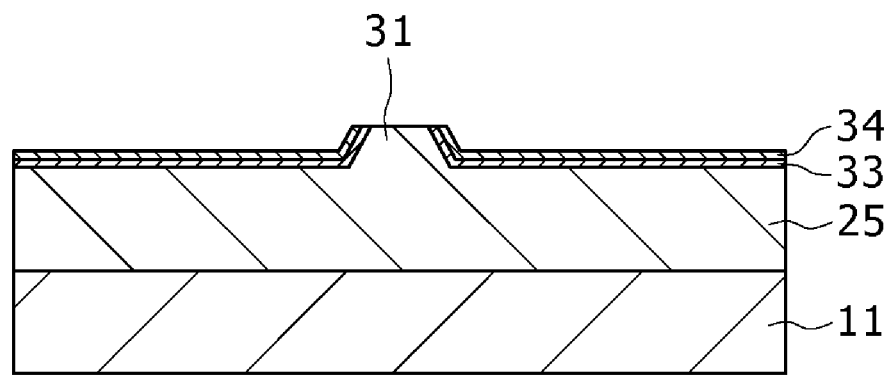
FIGS. 19A and 19B are still another sectional views for illustrating the method of manufacturing the GaN semiconductor laser according to the first embodiment of the present invention.
Figure 19B:
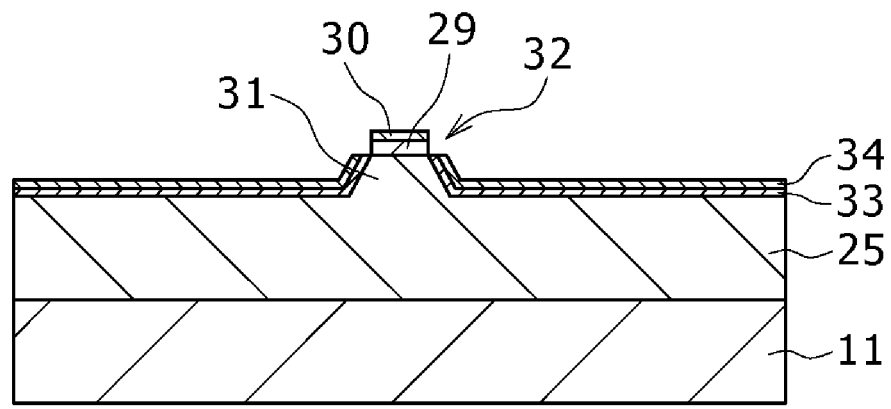
Figure 20:
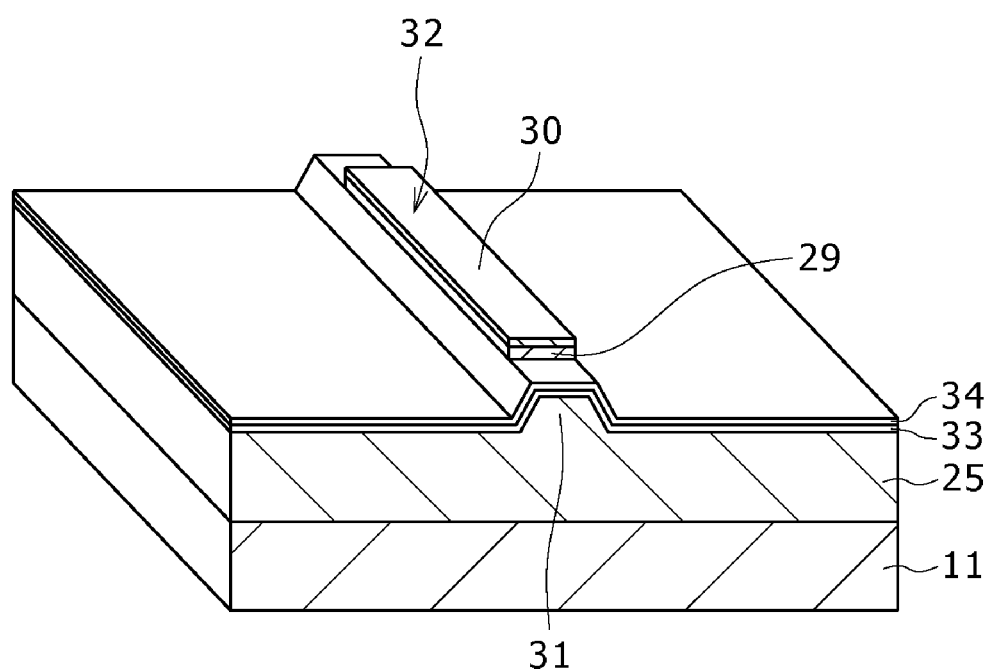
FIG. 20 is still another perspective view for illustrating the method of manufacturing the GaN semiconductor laser according to the first embodiment of the present invention.
Figure 21:
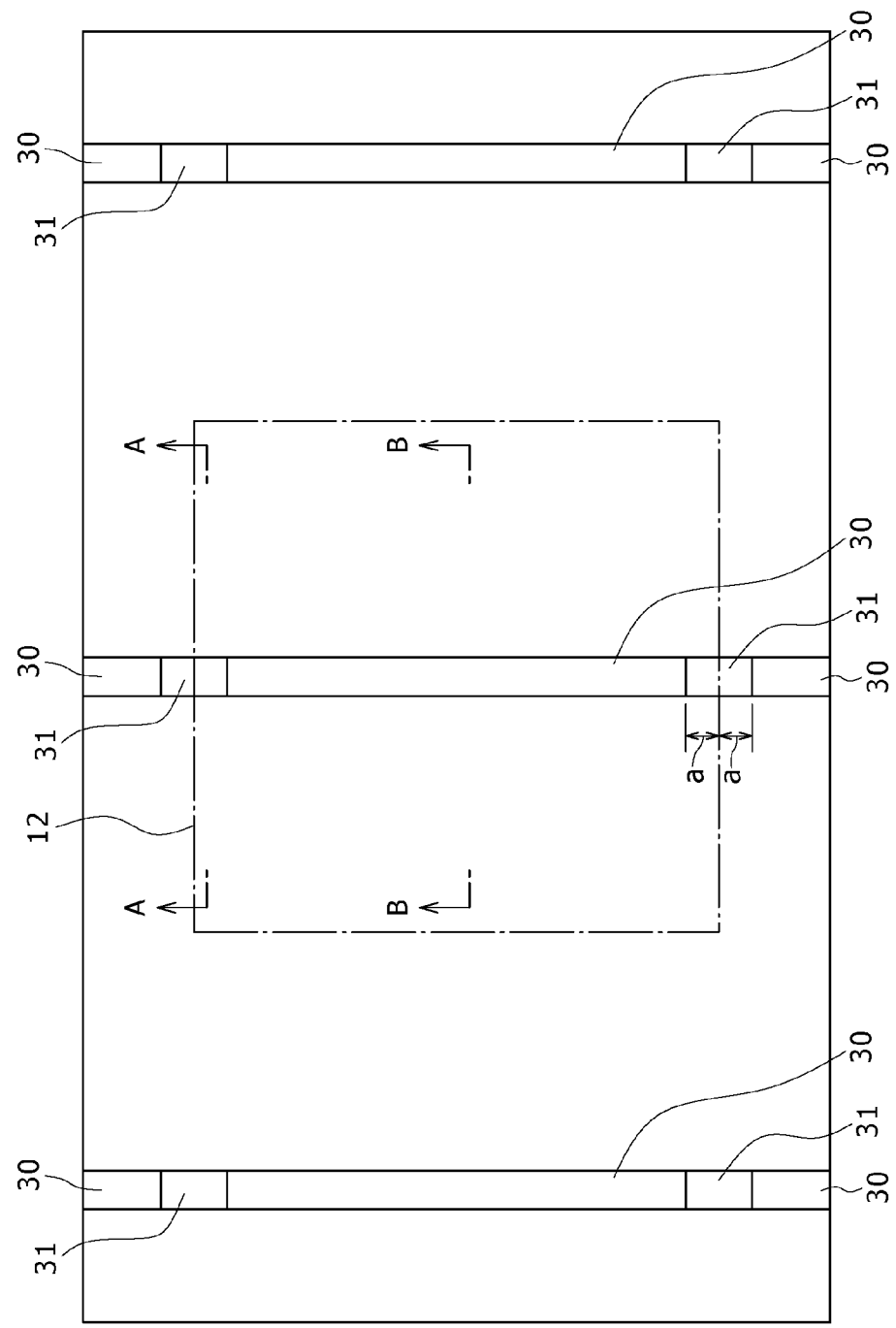
FIG. 21 is still another plan view for illustrating the method of manufacturing the GaN semiconductor laser according to the first embodiment of the present invention.

Next, as shown in FIGS. 19A and 19B, the resist 35 is removed. FIG. 20 is a perspective view of the thus obtained condition, and FIG. 21 is a plan view of this condition. Here, FIG. 19A is a sectional view taken along line A-A of FIG. 21, and FIG. 19B is a sectional view taken along line B-B of FIG. 21.

Figure 22A:
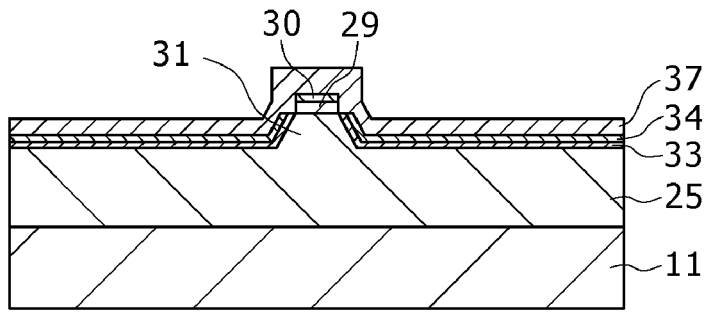
FIGS. 22A, 22B and 22C are still another sectional views for illustrating the method of manufacturing the GaN semiconductor laser according to the first embodiment of the present invention.

Subsequently, as shown in FIG. 22A, an insulating film 37 is formed on the whole surface inclusive of the area of the Pd film 29 and the Pt film 30 by vacuum evaporation or the like. A non-limitative example of the insulating film 37 is a $SiO_2$ film. The thickness of the insulating film 37 may be, for example, 200 μm, which is not limitative.

Figure 22B:
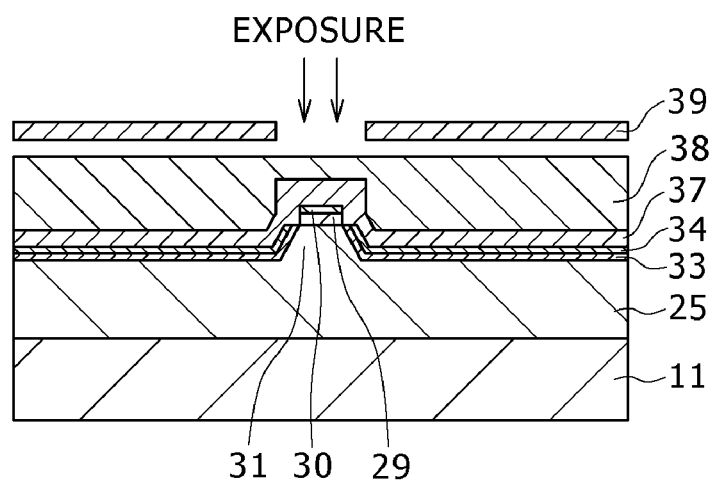

Next, as shown in FIG. 22B, the insulating film 37 is coated with a resist 38, and the resist 38 is exposed by using a photomask 39 provided with a mask pattern in a predetermined shape. The thickness of the resist 38 may be, for example, 0.8 μm, which is non-limitative.

Figure 22C:
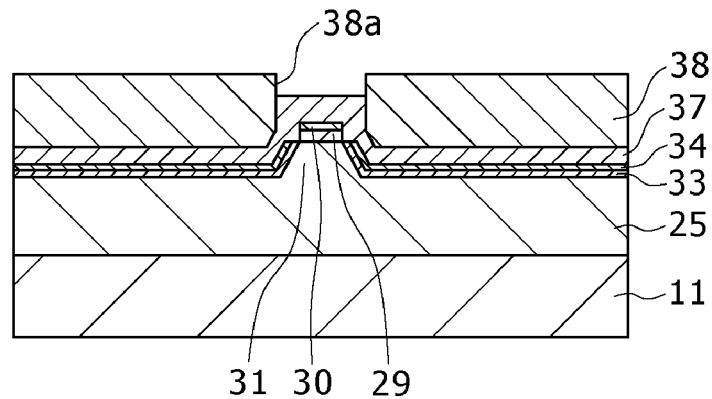

Subsequently, as shown in FIG. 22C, the thus selectively exposed resist 38 is subjected to development, to form an opening 38a on the upper side of the ridge stripe 31.

Figure 23A:
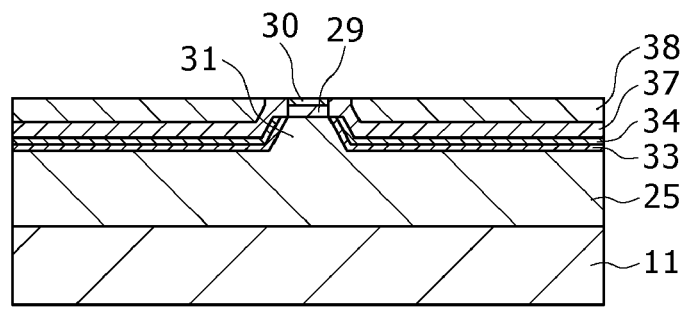
FIGS. 23A, 23B and 23C are still another sectional views for illustrating the method of manufacturing the GaN semiconductor laser according to the first embodiment of the present invention.

Next, as shown in FIG. 23A, the resist 38 and the insulating film 37 are etched back by, for example, the RIE process to etch away the insulating film 38 on the upper side of the ridge stripe 31, thereby exposing the Pt film 30.

Figure 23B:
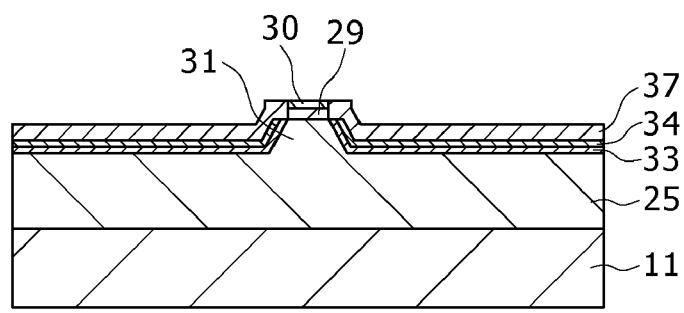

Subsequently, as shown in FIG. 23B, the resist 38 is removed.

Figure 23C:
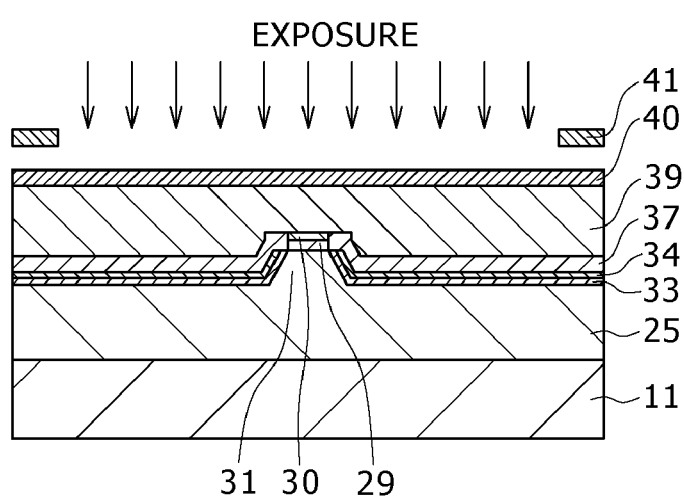

Next, as shown in FIG. 23C, a resist 39 is applied to the insulating film 37 and the Pt film 30, and the surface of the resist 39 is cured by treating it with chlorobenzene, to form a cured layer 40. The total thickness of the resist 39 and the cured layer 40 may be, for example, 3.0 μm, which is not limitative. Subsequently, the resist 39 and the cured layer 40 are exposed by using a photomask 41 provided with a mask pattern in a shape corresponding to an isolation electrode.

Figure 24A:
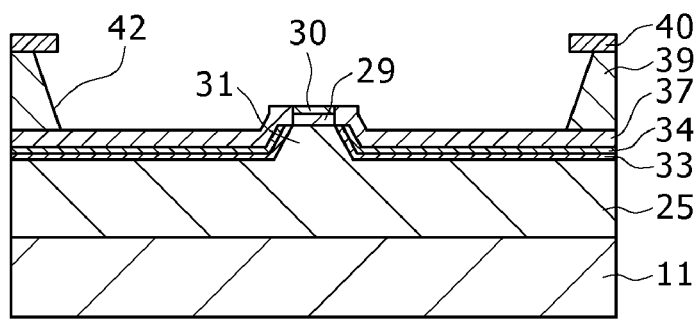
FIGS. 24A, 24B and 24C are still another sectional views for illustrating the method of manufacturing the GaN semiconductor laser according to the first embodiment of the present invention.

Next, as shown in FIG. 24A, the resist 39 and the cured layer 40 thus exposed are subjected to development, to form an opening 42 in a predetermined shape. In this instance, the cured layer 40 is in the eaves-like shape projecting toward the inside of the opening 42.

Figure 24B:
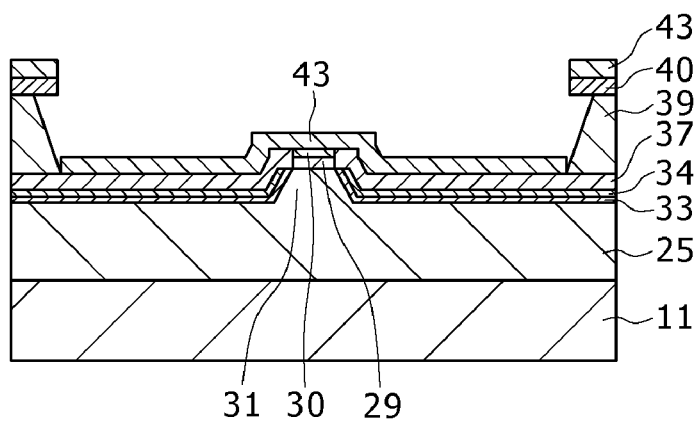

Subsequently, as shown in FIG. 24B, with the resist 39 and the cured layer 40 left as they are, for example, a Ti film, a Pt film and a Ni film are sequentially formed by, for example, vacuum evaporation from the direction orthogonal to the surface of the n-type GaN substrate 11, to form a Ti/Pt/Ni film 43. A non-limitative example of the configuration of the Ti/Pt/Ni film 43 is such that the lowermost Ti film has a thickness of 10 nm, the Pt film has a thickness of 100 nm, and the uppermost Ni film has a thickness of 100 nm.

Figure 24C:
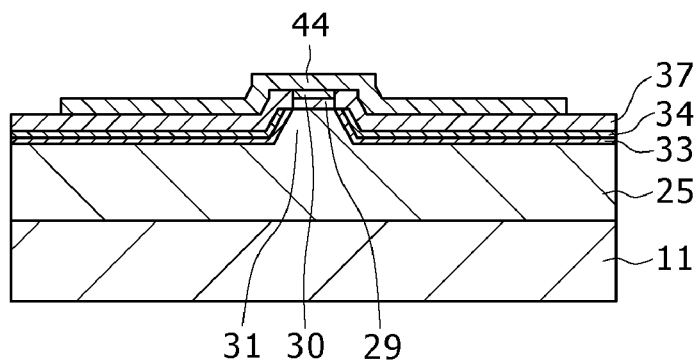

Next, the resist 39 and the cured layer 40 are removed (lifted off) together with the Ti/Pt/Ni film 43 formed thereon. In this case, since the cured layer 40 has the eaves-like shape projecting toward the inside of the opening 42, the lift-off operation can be easily carried out. In this manner, the isolation electrode 44 including the Ti/Pt/Ni film 43 is formed, as shown in FIG. 24C.

Figure 25A:
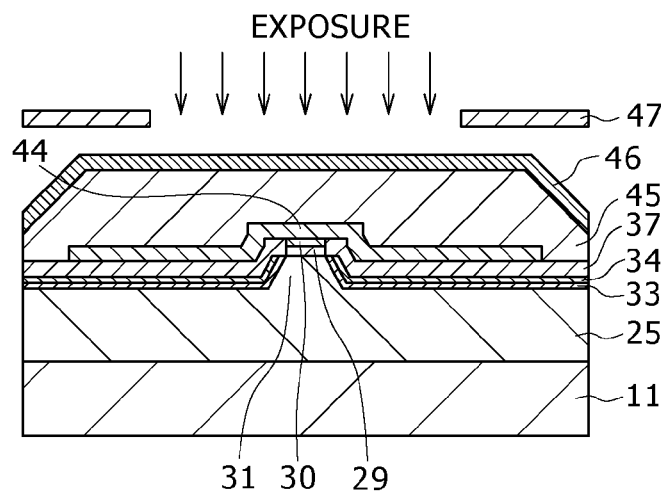
FIGS. 25A, 25B and 25C are still another sectional views for illustrating the method of manufacturing the GaN semiconductor laser according to the first embodiment of the present invention.

Subsequently, as shown in FIG. 25A, a resist 45 is applied to the whole surface so as to cover the isolation electrode 44, and then the surface of the resist 45 is cured by treating it with chlorobenzene, to form a cured layer 46. The total thickness of the resist 45 and the cured layer 46 may be, for example, 3.0 μm, which is non-limitative. Next, the resist 45 and the cured layer 46 are exposed using a photomask 47 provided with a mask pattern in a shape corresponding to a pad electrode.

Figure 25B:
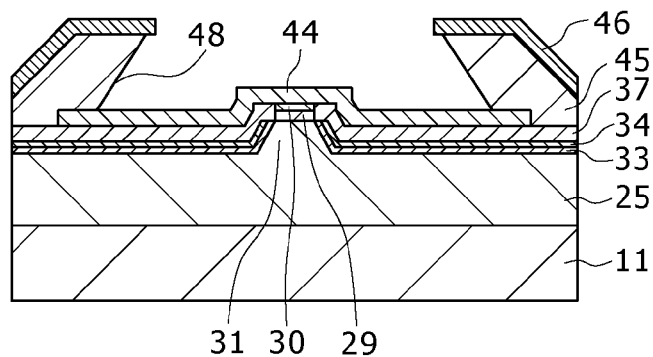

Subsequently, as shown in FIG. 25B, the resist 45 and the cured layer 46 thus exposed are subjected to development, to form an opening 48 in a predetermined shape. In this instance, the cured layer 46 is in an eaves-like shape projecting toward the inside of the opening 48.

Figure 25C:
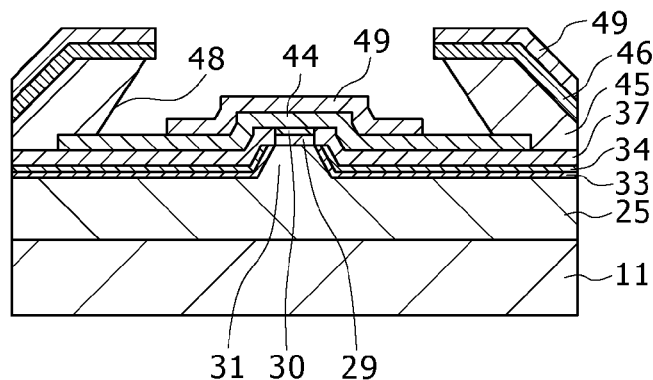

Next, as shown in FIG. 25C, with the resist 45 and the cured layer 46 left as they are, for example, a Ti film, a Pt film and a Au film are sequentially formed by, for example, vacuum evaporation from the direction orthogonal to the surface of the n-type GaN substrate 11, to form a Ti/Pt/Au film 49. A non-limitative example of the configuration of the Ti/Pt/Au film 49 is such that the lowermost Ti film has a thickness of 10 nm, the Pt film has a thickness of 100 nm, and the uppermost Au film has a thickness of 300 nm.

Figure 26:
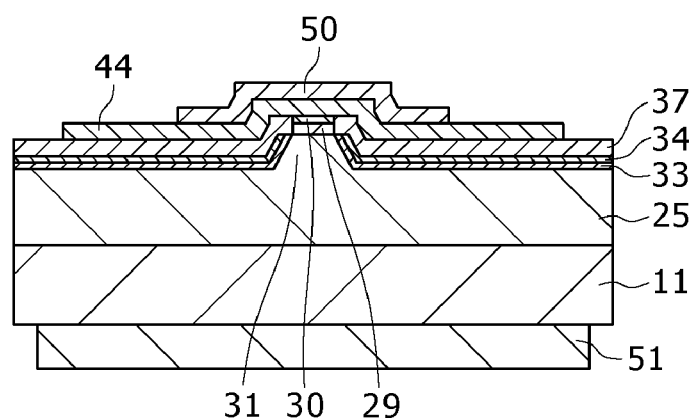
FIG. 26 is still another sectional view showing the GaN semiconductor laser manufactured according to the first embodiment of the present invention.

Subsequently, the resist 45 and the cured layer 46 are removed (lifted off) together with the Ti/Pt/Au film 49 formed thereon. In this case, since the cured layer 46 has the eaves-like shape projecting toward the inside of the opening 48, the lift-off operation can be easily carried out. In this manner, the pad electrode 50 including the Ti/Pt/Au film 49 is formed, as shown in FIG. 26.

Next, an n-side electrode 51 is formed on the back side of the n-type GaN substrate 11 in each chip region 12 by a lift-off method, for example.

Subsequently, the n-type GaN substrate 11 provided with the laser structures in the above-mentioned manner is subjected to cleavage along the resonator end face forming positions 13, 14 and the like operations, to form laser bars, thereby forming both resonator end faces. Next, the resonator end faces are subjected to end face coating, and then the laser bars are subjected to cleavage and the like operations, to divide them into chips.

In this manner, the objective GaN semiconductor laser is manufactured.

Figure 27:
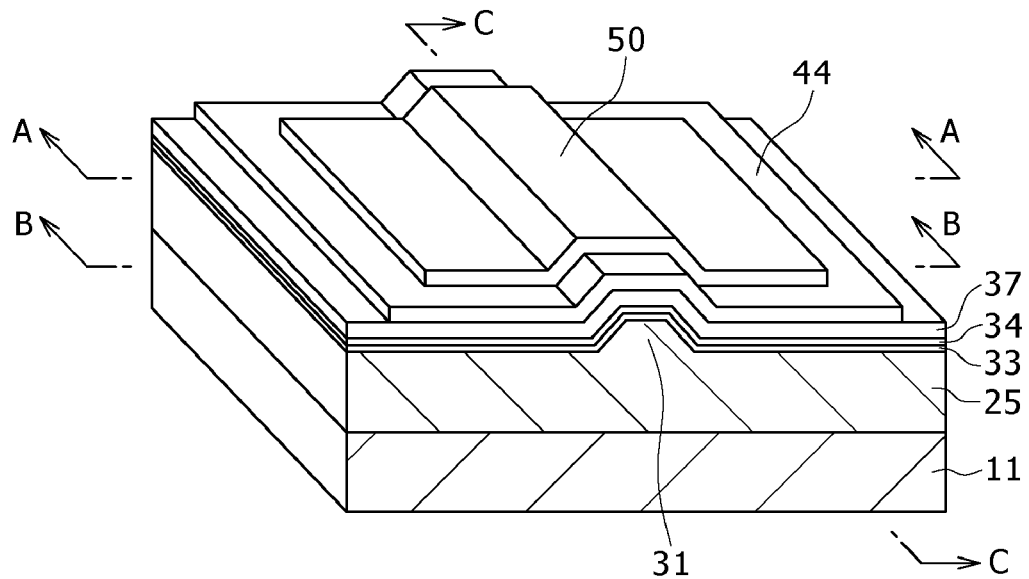
FIG. 27 is still another perspective view showing the GaN semiconductor laser manufactured according to the first embodiment of the present invention.
Figure 28A:
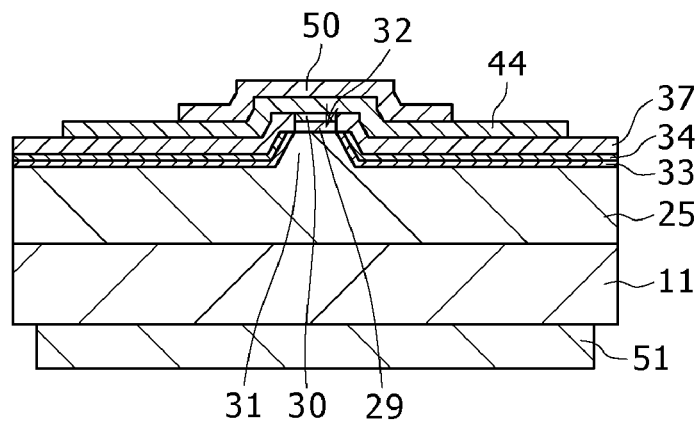
FIGS. 28A, 28B and 28C are still another sectional views showing the GaN semiconductor laser manufactured according to the first embodiment of the present invention.
Figure 28B:
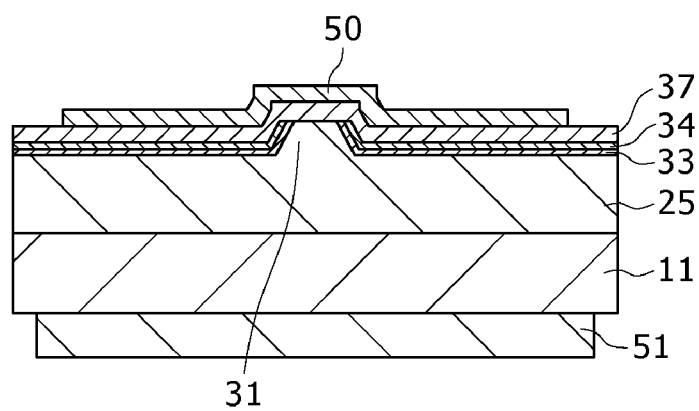
Figure 28C:
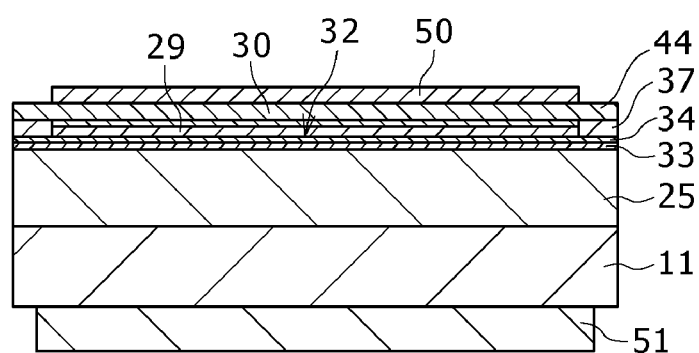

The GaN semiconductor laser thus obtained in a chip form is shown in FIG. 27 and FIGS. 28A, 28B and 28C. Here, FIG. 27 is a perspective view, FIG. 28A is a sectional view taken along line A-A of FIG. 27, FIG. 28B is a sectional view taken along line B-B of FIG. 27, and FIG. 28C is a sectional view taken along line C-C of FIG. 27. In this GaN semiconductor laser, the p-side electrode 32 including the Pd film 29 and the Pt film 30 is not formed in the areas of width a along the resonator length direction from each of the resonator end faces, and these areas serve as current non-injection regions.

Figure 29A:
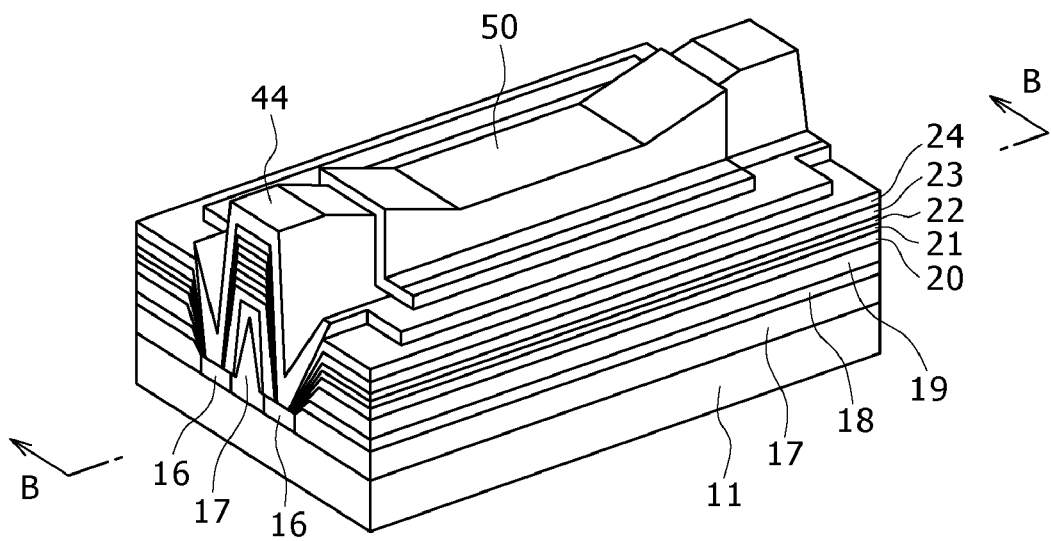
FIGS. 29A and 29B are respectively a perspective view and a sectional view which illustrate a detailed structure of the GaN semiconductor laser manufactured according to the first embodiment of the present invention.
Figure 29B:
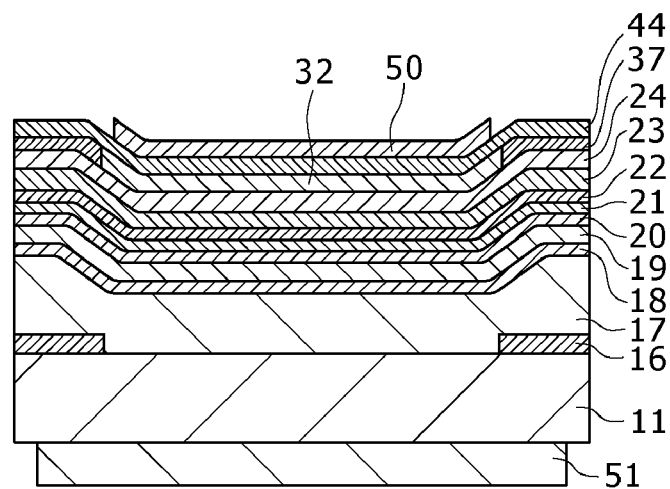

FIGS. 29A and 29B illustrate a detailed structure of the GaN semiconductor laser. Here, FIG. 29A is a perspective view, and FIG. 29B is a sectional view taken along line B-B of FIG. 29A.

Figure 42:
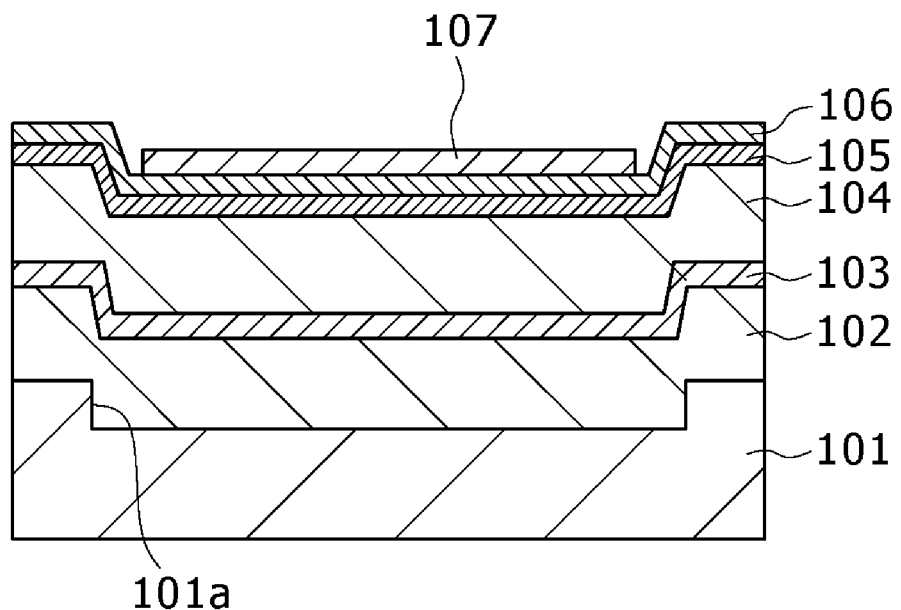
FIG. 42 is a sectional view of a GaN semiconductor laser manufactured by a method of forming an end face window structure according to the related art.

According to the first embodiment of the present invention, the following merits can be obtained. By only preliminarily forming the insulating film masks 16 on the n-type GaN substrate 11 and growing thereon the GaN semiconductor layer 25 for forming the laser structure, the band gap energy of the active layer 19 in the areas in the areas near the resonator end face forming positions 13, 14 can be set higher than in the other area, so that the end face window structure can be formed very easily. In addition, the thickness of the GaN semiconductor layer 25 in the area between a pair of the insulating film masks 16 is gradually increased along the resonator length direction toward the resonator end face forming position 13, 14, so that no steep step is generated. Therefore, the optical waveguide loss can be suppressed remarkably, as contrasted to the case where the semiconductor layer for forming the laser structure has a steep step in each area ranging from a recess 101a to the outer side thereof, as in a semiconductor laser according to the related art shown in FIG. 42. Besides, the semiconductor layer forming the laser structure need not be dug by RIE so as to form the end face window structure, so that formation of a surface level at the time of forming the end face window structure is obviated, and the problem of light absorption or local heat generation at the time of laser operation due to such a surface level can be obviated.

In addition, according to the first embodiment, it is possible to easily manufacture a GaN semiconductor laser having a structure in which a ridge stripe 31 is formed for the p-side electrode 32 including a Pd film 29 and a Pt film 30 formed in a stripe shape, wherein portions, in the vicinity of both resonator end faces, of the p-side electrode 32 are removed so that both end parts of the resonator serve as current non-injection regions. The GaN semiconductor laser, with both end parts of the resonator serving as current non-injection regions, can effectively prevent catastrophic optical damage (COD) to the resonator end faces, whereby enhanced lifetime and reliability are promised.

Now, a method of manufacturing a GaN semiconductor laser according to a second embodiment of the present invention will be described below.

Figure 30:
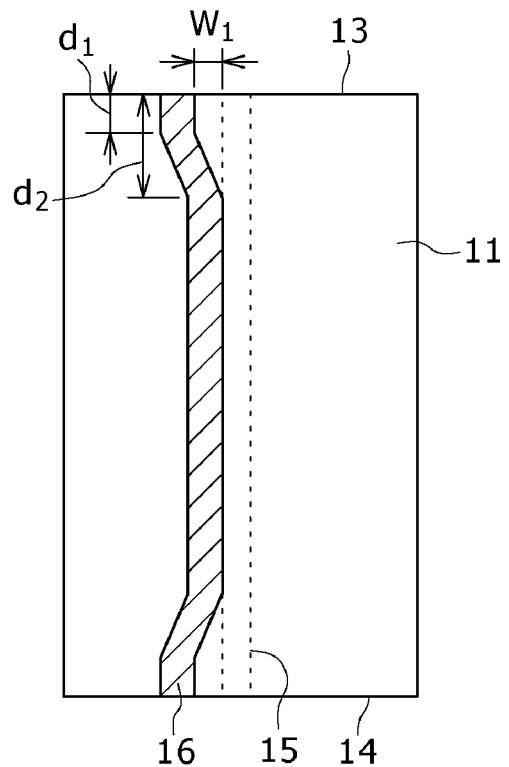
FIG. 30 is a plan view for illustrating the method of manufacturing a GaN semiconductor laser according to a second embodiment of the present invention.

In the second embodiment, first, as shown in FIG. 30, an elongate insulating film mask 16 with a fixed width is formed on a n-type GaN substrate 11 on one side of the ridge stripe forming position 15 and along the whole length of the resonator in the resonator length direction. One edge of the insulating film mask 16 on the ridge stripe forming position 15 side is coinciding with one edge of the ridge stripe forming position 15, in its central portion in the resonator length direction. However, in its portion within a distance $d_1$ from each of the resonator end face forming position 13, 14, the one edge of the insulating film mask 16 is spaced from the ridge stripe forming position 15 by a spacing $w_1$, and, in the portion at a distance $d_1$ to $d_2$ from each of the resonator end face forming positions 13, 14, the spacing is gradually reduced from $w_1$ to 0. One non-limitative example of the dimensions is such that $d_1$ is 20 μm, $d_2$ is 50 μm, the width of the insulating film mask 16 is 5 μm, and $w_1$ is 5 to 10 μm.

Next, in the same manner as in the first embodiment, the GaN semiconductor layer 25 for forming the laser structure is grown over the n-type GaN substrate 11 (provided with the insulating film mask 16) by the MOCVD method, for example. In this case, as for the active layer 19 containing In and Ga, the distance from the edge of the insulating film mask 16 to the ridge stripe forming position 15 in the portion within a distance $d_2$ from each of the resonator end face forming position 13, 14 is larger than in the central portion in the resonator length direction. Therefore, of the In atoms and Ga atoms supplied onto the insulating film mask 16, the In atoms (the diffusion length of which is smaller than that of the Ga atoms by a factor of about one order of magnitude) are supplied to the ridge stripe forming position 15 in the portion within the distance $d_2$ in an amount smaller than that of the Ga atoms. As a result, the In content of the active layer 19 becomes uneven along the resonator length direction. Specifically, the In content is lower in the portions near the resonator end face forming positions 13, 14 than in the other portion, and the band gap energy in the portions near the end face forming positions 13, 14 is higher than the band gap energy in the other portion. Thus, the portions, where the band gap energy is higher, of the active layer 19 serve as the end face window structure.

Thereafter, the subsequent steps are carried out in the same manner as in the first embodiment, to manufacture the objective GaN semiconductor laser.

According to the second embodiment, merits equivalent to those of the first embodiment can be obtained.

Now, a method of manufacturing a GaN semiconductor laser according to a third embodiment of the present invention will be described below.

Figure 31:
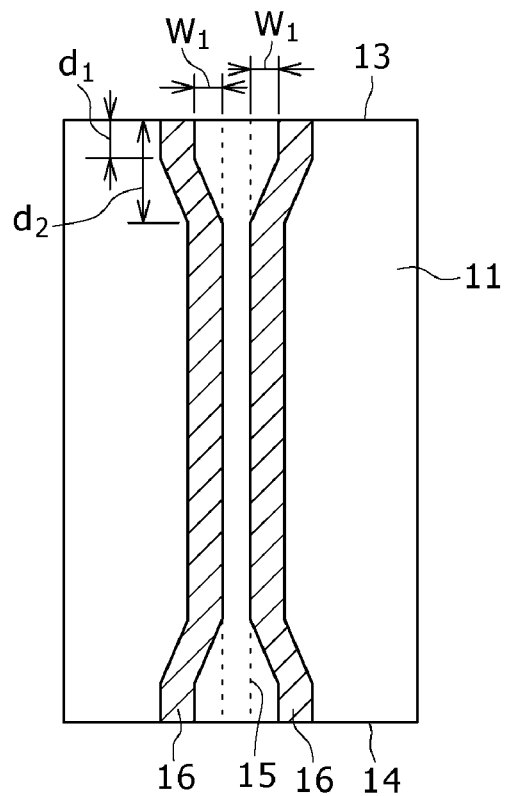
FIG. 31 is a plan view for illustrating the method of manufacturing a GaN semiconductor laser according to a third embodiment of the present invention.

In the third embodiment, first, as shown in FIG. 31, the insulating film mask 16 used in the second embodiment is formed on the n-type GaN substrate 11 on each of both sides of the ridge stripe forming position 15, in line symmetry. One non-limitative example of the dimensions is such that $d_1$ is 20 μm, $d_2$ is 50 μm, the width of the insulating film mask 16 is 5 μm, and the spacing $w_1$ between the insulating film mask 16 and the ridge stripe forming position 15 is 3 to 20 μm.

Next, in the same manner as in the first embodiment, the GaN semiconductor layer 25 is grown on the n-type GaN substrate 11 (provided with the insulating film masks 16) by the MOCVD method, for example. In this case, as for the active layer 19 containing In and Ga, in the area between the pair of the insulating film masks 16 in the portions within a distance $d_2$ from the resonator end face forming positions 13, 14, the spacing between the insulating film masks 16 is larger and the distance from the edge of the insulating film mask 16 to the ridge stripe forming position 15 is larger, as compared with those in a central area in the resonator length direction. Therefore, of the In atoms and Ga atoms supplied onto the insulating film masks 16 on both sides of this area between the pair of insulating film masks 16, the In atoms (the diffusion length of which is smaller than that of the Ga atoms by a factor of about one order of magnitude) are supplied to the ridge stripe forming position 15 in the portion within the distance $d_2$ in an amount smaller than that of the Ga atoms. As a result, the In content of the active layer 19 becomes uneven along the resonator length direction. Specifically, the In content is lower in the portions near the resonator end face forming positions 13, 14 between the pair of insulating film masks 16 than in the other portion, and the band gap energy in the portions near the end face forming positions 13, 14 is higher than the band gap energy in the other portion. Thus, the portions, where the band gap energy is higher, of the active layer 19 serve as the end face window structure.

Thereafter, the subsequent steps are carried out in the same manner as in the first embodiment, to manufacture the objective GaN semiconductor laser.

According to the third embodiment, merits equivalent to those of the first embodiment can be obtained.

Now, a method of manufacturing a GaN semiconductor laser according to a fourth embodiment of the present invention will be described below.

Figure 32:
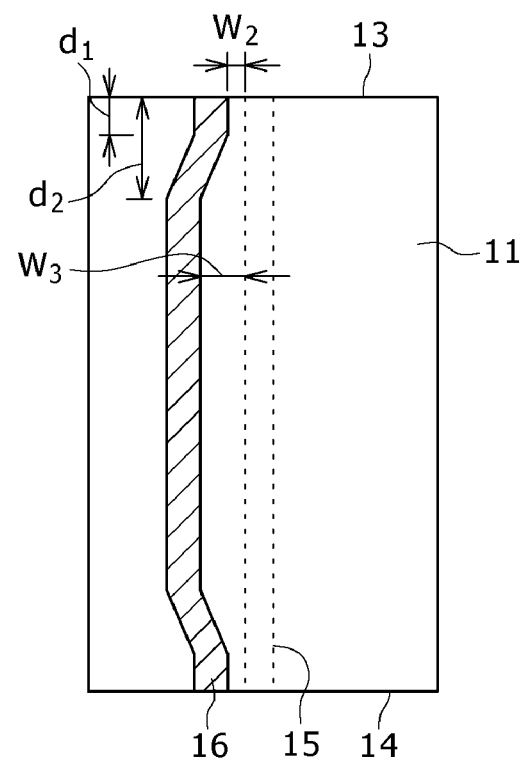
FIG. 32 is a plan view for illustrating the method of manufacturing a GaN semiconductor laser according to a fourth embodiment of the present invention.

In the fourth embodiment, first, as shown in FIG. 32, an elongate insulating film mask 16 with a fixed width is formed on the n-type GaN substrate 11 on one side of the ridge stripe forming position 15 and over the whole length of the resonator in the resonator length direction. The spacing between one edge of the insulating film mask 16 on the ridge stripe forming position 15 side and one edge of the ridge stripe forming position 15 is w2 in the portion within a distance $d_1$ from each of the resonator end face forming positions 13, 14, whereas in the portion at a distance of $d_1$ to $d_2$, the spacing is linearly increased from $w_2$ to $w_3$, to be $w_3$ in a central portion in the resonator length direction. One non-limitative example of the dimensions is such that $d_1$ is 20 μm, $d_2$ is 50 μm, the width of the insulating film mask 16 is 5 μm, $w_2$ is 3 to 5 μm, and $w_3$ is 10 μm.

Next, in the same manner as in the first embodiment, the GaN semiconductor layer 25 for forming the laser structure is grown on the n-type GaN substrate 11 (provided with the insulating film mask 16) by the MOCVD method, for example. In this case, as for the active layer 19 containing In and Ga, the distance from the edge of the insulating film mask 16 to the ridge stripe forming position 15 in the portion within the distance $d_2$ from each of the resonator end face forming position 13, 14 is larger than that in the central portion in the resonator length direction. Therefore, of the In atoms and Ga atoms supplied onto the insulating film mask 16, the In atoms (the diffusion length of which is smaller than that of the Ga atoms by a factor of about one order of magnitude) are supplied to the ridge stripe forming position 15 in the portion within the distance $d_2$ in an amount smaller than that of the Ga atoms. As a result, the In content of the active layer 19 becomes uneven along the resonator length direction. Specifically, the In content is lower in the portions near the resonator end face forming positions 13, 14 than in the other portion, and the band gap energy in the portions near the end face forming positions 13, 14 is higher than the band gap energy in the other portion. Thus, the portions, where the band gap energy is higher, of the active layer 19 serve as the end face window structure.

Thereafter, the subsequent steps are carried out in the same manner as in the first embodiment, to manufacture the objective GaN semiconductor laser.

According to the fourth embodiment, merits equivalent to those of the first embodiment can be obtained.

Now, a method of manufacturing a GaN semiconductor laser according to a fifth embodiment of the present invention will be described below.

Figure 33:
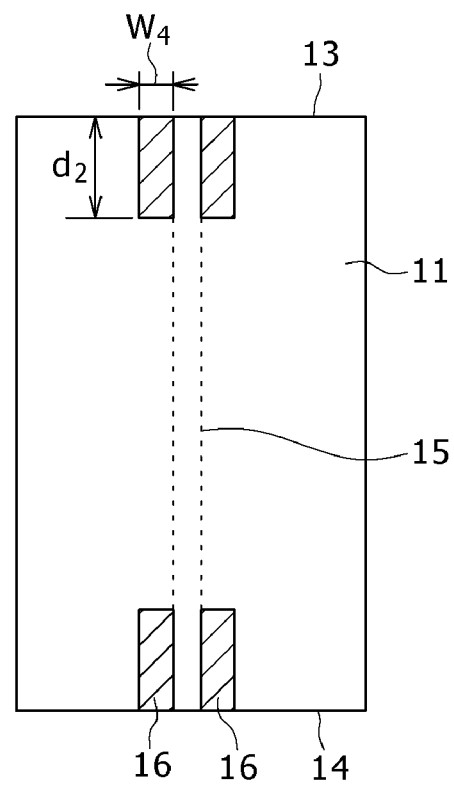
FIG. 33 is a plan view for illustrating the method of manufacturing a GaN semiconductor laser according to a fifth embodiment of the present invention.

In the fifth embodiment, first, as shown in FIG. 33, insulating film masks 16 rectangular in plan-view shape are formed on the n-type GaN substrate 11 in the vicinity of the resonator end face forming positions 13, 14 and on both sides of the ridge stripe forming position 15, in line symmetry with respect to the ridge stripe forming position 15. The edge of each insulating film mask 16 on the ridge stripe forming position 15 side is coinciding with the edge of the ridge stripe forming position 15. Each of the insulating film masks 16 has a fixed width $W_4$ in the resonator length direction. One non-limitative example of the dimensions is such that $d_1$ is 20 to 50 μm, and the width of the insulating film mask 16 is 5 to 10 μm.

Next, in the same manner as in the first embodiment, the GaN semiconductor layer 25 for forming the laser structure is grown on the n-type GaN substrate 11 (provided with the insulating film mask 16) by the MOCVD method, for example. In this case, as for the active layer 19 containing In and Ga, in the portion within a distance $d_2$ from each of the resonator end face forming positions 13, 14, of the In atoms and Ga atoms supplied onto the insulating film masks 16 on both sides of this portion, the In atoms (the diffusion length of which is smaller than that of the Ga atoms by a factor of about one order of magnitude) are supplied to the ridge stripe forming position 15 in an amount smaller than that of the Ga atoms, the situation being different from the situation in the central portion in the resonator length direction. As a result, the In content of the active layer 19 becomes uneven along the resonator length direction. Specifically, the In content is lower in the portions near the resonator end face forming positions 13, 14 which portions are located between the pair of insulating film masks 16, than in the other portion, and the band gap energy in the portions near the end face forming positions 13, 14 is higher than the band gap energy in the other portion. Thus, the portions, where the band gap energy is lower, of the active layer 19 serve as the end face window structure.

Thereafter, the subsequent steps are carried out in the same manner as in the first embodiment, to manufacture the objective GaN semiconductor laser.

According to the fifth embodiment, merits equivalent to those of the first embodiment can be obtained.

Now, a method of manufacturing a GaN semiconductor laser according to a sixth embodiment of the present invention will be described below.

Figure 34:
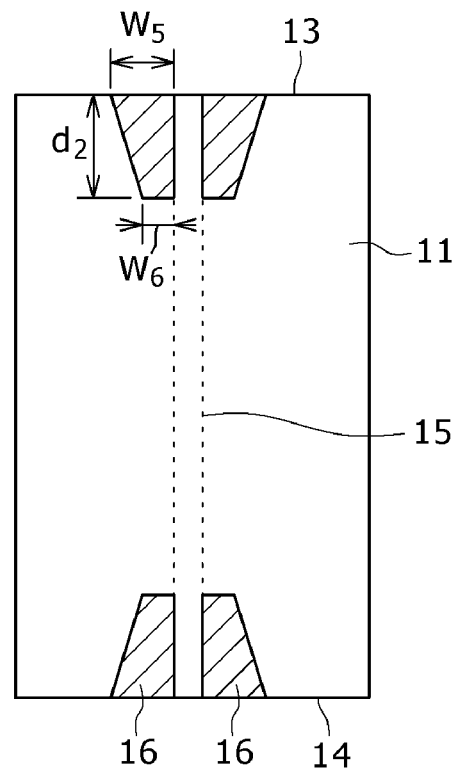
FIG. 34 is a plan view for illustrating the method of manufacturing a GaN semiconductor laser according to a sixth embodiment of the present invention.

In the sixth embodiment, first, as shown in FIG. 34, insulating film masks 16 trapezoidal in plan-view shape are formed on the n-type GaN substrate 11 in the vicinity of the resonator end face forming positions 13, 14 and on both sides of the ridge stripe forming position 15, in line symmetry with respect to the ridge stripe forming position 15. The edge of each insulating film mask 16 on the ridge stripe forming position 15 side is coinciding with the edge of the ridge stripe forming position 15. The width of each of the insulating film masks 16 is linearly reduced from $w_5$ to $w_6$, in the portion within a distance $d_2$ from each of the resonator end face forming positions 13, 14. One non-limitative example of the dimensions is such that $d_2$ is 20 to 50 μm, $w_5$ is 10 to 20 μm, and $w_6$ is 5 μm.

Next, in the same manner as in the first embodiment, the GaN semiconductor layer 25 for forming the laser structure is grown on the n-type GaN substrate 11 (provided with the insulating film mask 16) by the MOCVD method, for example. In this case, as for the active layer 19 containing In and Ga, in the portion within a distance $d_2$ from each of the resonator end face forming positions 13, 14, of the In atoms and Ga atoms supplied onto the insulating film masks 16 on both sides of this portion, the In atoms (the diffusion length of which is smaller than that of the Ga atoms by a factor of about one order of magnitude) are supplied to the ridge stripe forming position 15 in an amount smaller than that of the Ga atoms, the situation being different from the situation in the central portion in the resonator length direction. As a result, the In content of the active layer 19 becomes uneven along the resonator length direction. Specifically, the In content is lower in the portions near the resonator end face forming positions 13, 14 which portions are located between the pair of insulating film masks 16, than in the other portion, and the band gap energy in the portions near the end face forming positions 13, 14 is higher than the band gap energy in the other portion. Thus, the portions, where the band gap energy is higher, of the active layer 19 serve as the end face window structure.

Thereafter, the subsequent steps are carried out in the same manner as in the first embodiment, to manufacture the objective GaN semiconductor laser.

According to the sixth embodiment, merits equivalent to those of the first embodiment can be obtained.

Now, a method of manufacturing a GaN semiconductor laser according to a seventh embodiment of the present invention will be described below.

Figure 35:
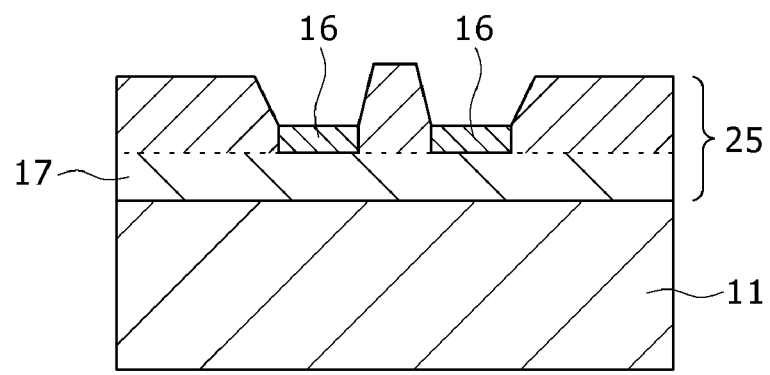
FIG. 35 is a plan view for illustrating the method of manufacturing a GaN semiconductor laser according to a seventh embodiment of the present invention.

In the seventh embodiment, insulating film masks 16 are not formed directly on the n-type GaN substrate 11, but, instead, for example, after the n-type AlGaN clad layer 17 is epitaxially grown on the whole surface of the n-type GaN substrate 11 in any of the first to sixth embodiments, the insulating film masks 16 are formed on the n-type AlGaN clad layer 17. Thereafter, in the same manner as in the first embodiment, the n-type GaN optical waveguide layer 18, the active layer 19, the undoped InGaN optical waveguide layer 20, the undoped AlGaN optical waveguide layer 21, the p-type AlGaN electron barrier layer 22, the p-type GaN/undoped AlGaN superlattice clad layer 23 and the p-type GaN contact layer 24 are sequentially grown epitaxially. One example of the condition upon the growth is shown in FIG. 35. FIG. 35 corresponds, for example, to a sectional view taken along line A-A of FIG. 8.

Thereafter, the subsequent steps are carried out in the same manner as in the first embodiment, to manufacture the objective GaN semiconductor laser.

According to the seventh embodiment, merits equivalent to those of the first embodiment can be obtained.

Now, a method of manufacturing a GaN semiconductor laser according to an eighth embodiment of the present invention will be described below.

Figure 36:
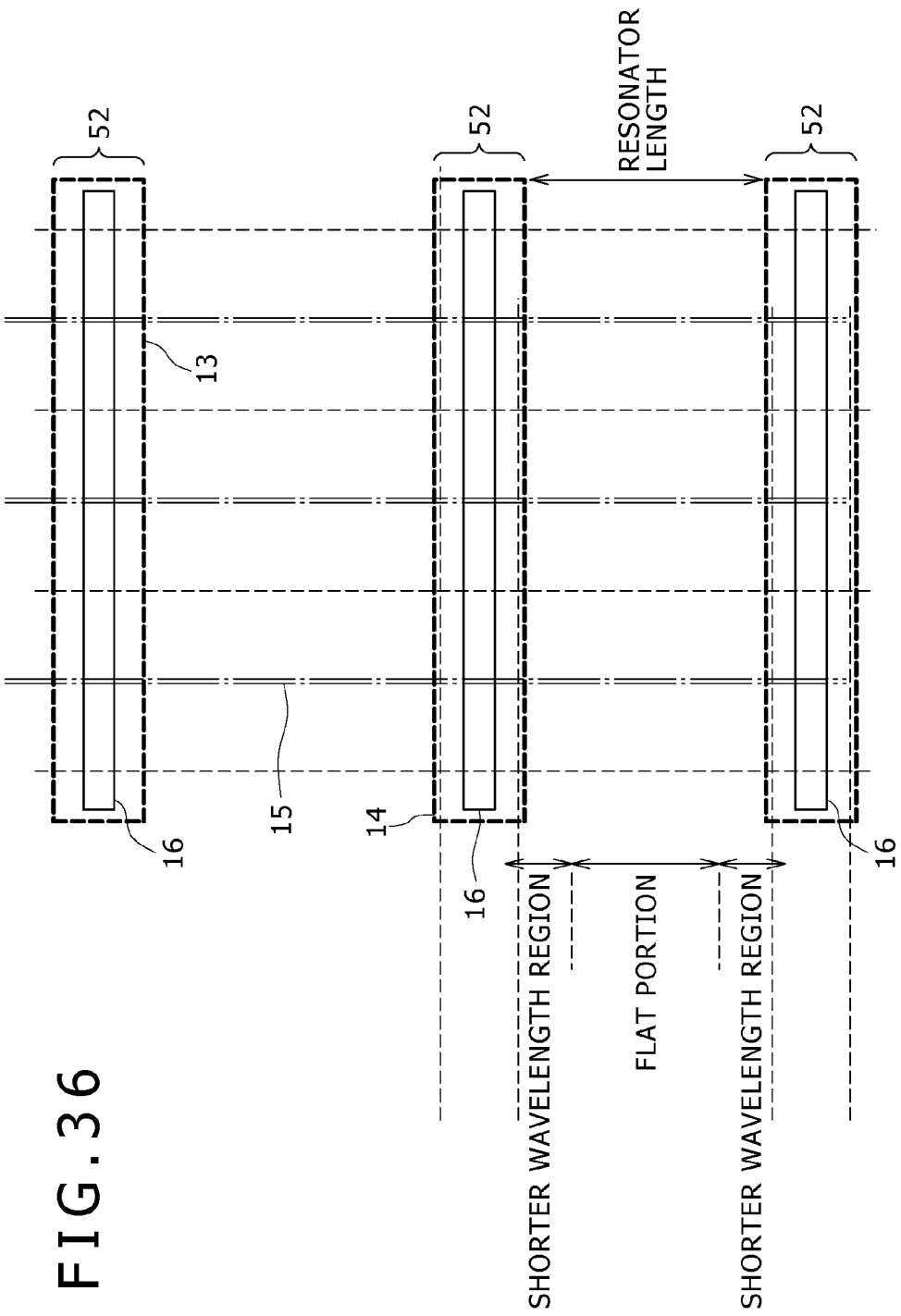
FIG. 36 is a plan view for illustrating the method of manufacturing a GaN semiconductor laser according to an eighth embodiment of the present invention.

In the eighth embodiment, as shown in FIG. 36, in defining chip regions 12 on the n-type GaN substrate 11, a discarded region 52 to be finally discarded is provided between each adjacent pair of the chip regions 12 adjacent to each other in the resonator length direction. Both edges of the discarded region 52 coincide with resonator end face forming positions 13, 14. An elongate insulating film mask 16 smaller in width than the discarded region 52 is provided in each discarded region 52, in parallel to the resonator end face forming positions 52. The width of the insulating film mask 16 is generally not less than 5 μm, for example, not less than 10 μm, but is not limited to such a value.

Next, in the same manner as in the first embodiment, the GaN semiconductor layer 25 for forming the laser structure is grown on the n-type GaN substrate 11 (provided with the insulating film masks 16) by the MOCVD method, for example. In this case, as for the active layer 19 containing In and Ga, of the In atoms and Ga atoms supplied onto the insulating film masks 16, the In atoms (of which the diffusion length is smaller than that of the Ga atoms by a factor of about one order of magnitude) are supplied to the ridge stripe forming position 15 in the portion at a predetermined distance from each of the resonator end face forming positions 13, 14 in an amount smaller than that of the Ga atoms. As a result, the In content of the active layer 19 becomes uneven along the resonator length direction. Specifically, the In content is lower in the portions near the resonator end face forming positions 13, 14 than in the other portion, and the band gap energy in the portions near the end face forming positions 13, 14 is higher than the band gap energy in the other portion. Thus, the portions, where the band gap energy is higher, of the active layer 19 serve as the end face window structure.

Thereafter, the subsequent steps are carried out in the same manner as in the first embodiment, to manufacture the objective GaN semiconductor laser. The discarded regions 52 are discarded upon the formation of the resonator end faces.

According to the eighth embodiment, merits equivalent to those of the first embodiment can be obtained.

Now, a method of manufacturing a GaN semiconductor laser according to a ninth embodiment of the present invention will be described below.

Figure 37:
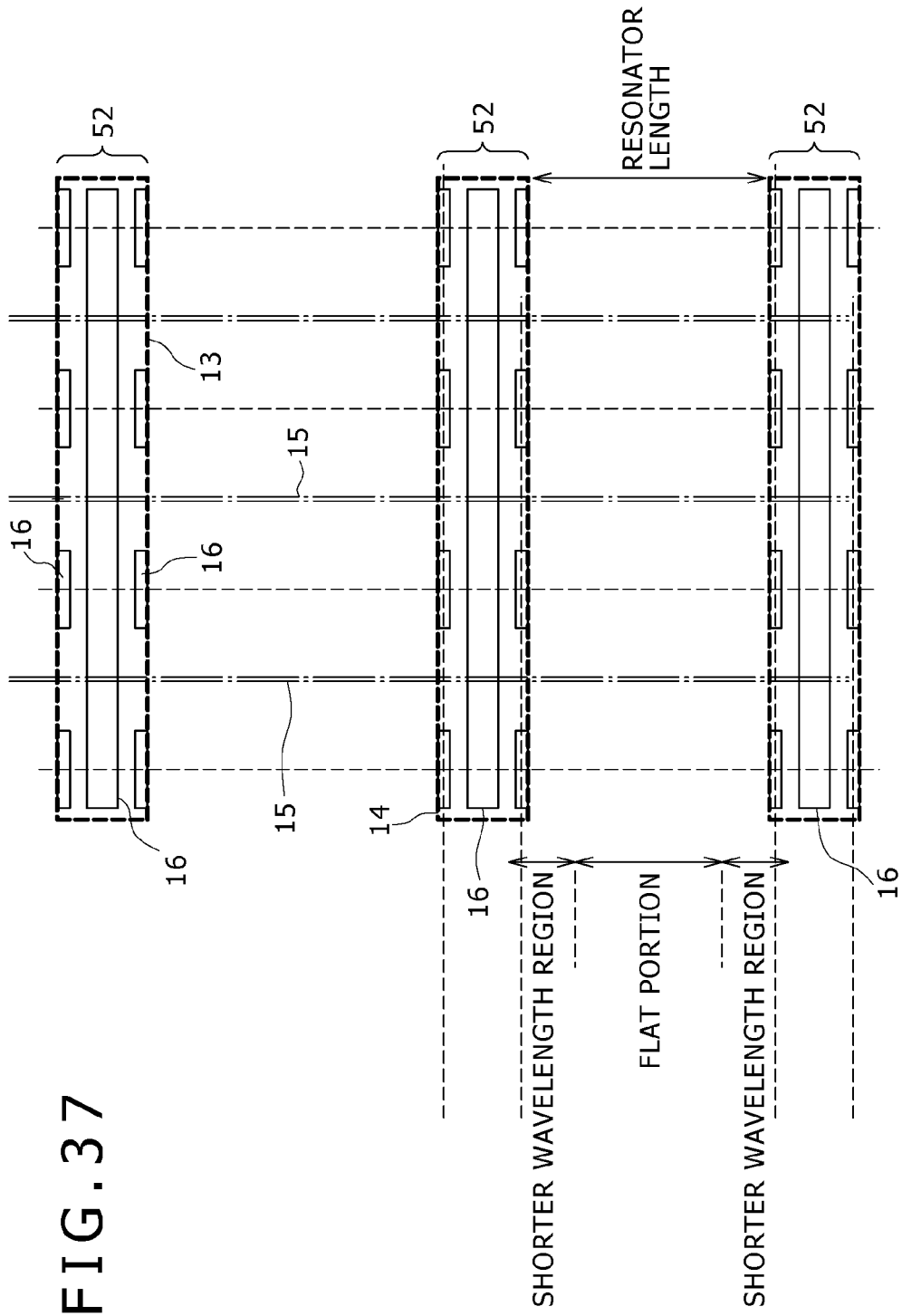
FIG. 37 is a plan view for illustrating the method of manufacturing a GaN semiconductor laser according to a ninth embodiment of the present invention.

In the ninth embodiment, as shown in FIG. 37, in the same manner as in the eighth embodiment, a discarded region 52 is provided between each adjacent pair of chip regions 12 adjacent to each other in the resonator length direction, and an insulating film mask 16 is provided in each discarded region 52. In addition, small-width strip-shaped insulating film masks 16 are provided in intermittently (in the form of broken lines) on the resonator end face forming positions 13, 14 and in a central area between each adjacent pair of ridge stripe forming regions 15.

Next, in the same manner as in the first embodiment, the GaN semiconductor layer 25 for forming the laser structure is grown on the n-type GaN substrate 11 (provided with the insulating film masks 16) by the MOCVD method, for example. In this case, the In content of the portions near the resonator end face forming positions 13, 14 is lower than that in the other portion, and the band gap energy in the portions near the resonator end face forming positions 13, 14 is higher than that in the other portion. The portions, where the band gap energy is higher, of the active layer 19 constitute the end face window structures, in the same manner as in the eighth embodiment; it is to be noted, however, that the GaN semiconductor layer 25 for forming the laser structure is not grown on the insulating film masks 16 provided in the intermittent form on the resonator end face forming positions 13, 14.

Thereafter, the subsequent steps are carried out in the same manner as in the first embodiment, to manufacture the objective GaN semiconductor laser. In this case, at the time of forming the resonator end faces, the cleavage along the resonator end face forming positions 13, 14 can be conducted easily and assuredly, since the GaN semiconductor layer 25 for forming the laser structure is not present on the insulating film masks 16 provided intermittently provided on the resonator end face forming positions 13, 14 and the mechanical strength is lower at the resonator end face forming positions 13, 14.

According to the ninth embodiment, merits equivalent to those of the first embodiment can be obtained.

Now, a method of manufacturing a GaN semiconductor laser according to the tenth embodiment of the present invention will be described below.

The GaN semiconductor laser in this embodiment has a window structure and a ridge stripe structure, and is different from the first embodiment in that both end parts of the resonator are not made to be current non-injection regions.

According to the tenth embodiment, it is possible to obtain merits equivalent to those of the first embodiment, except for the merit obtained in the first embodiment owing to the configuration in which both end parts of the resonator are made to be the current non-injection regions.

Figure 38:
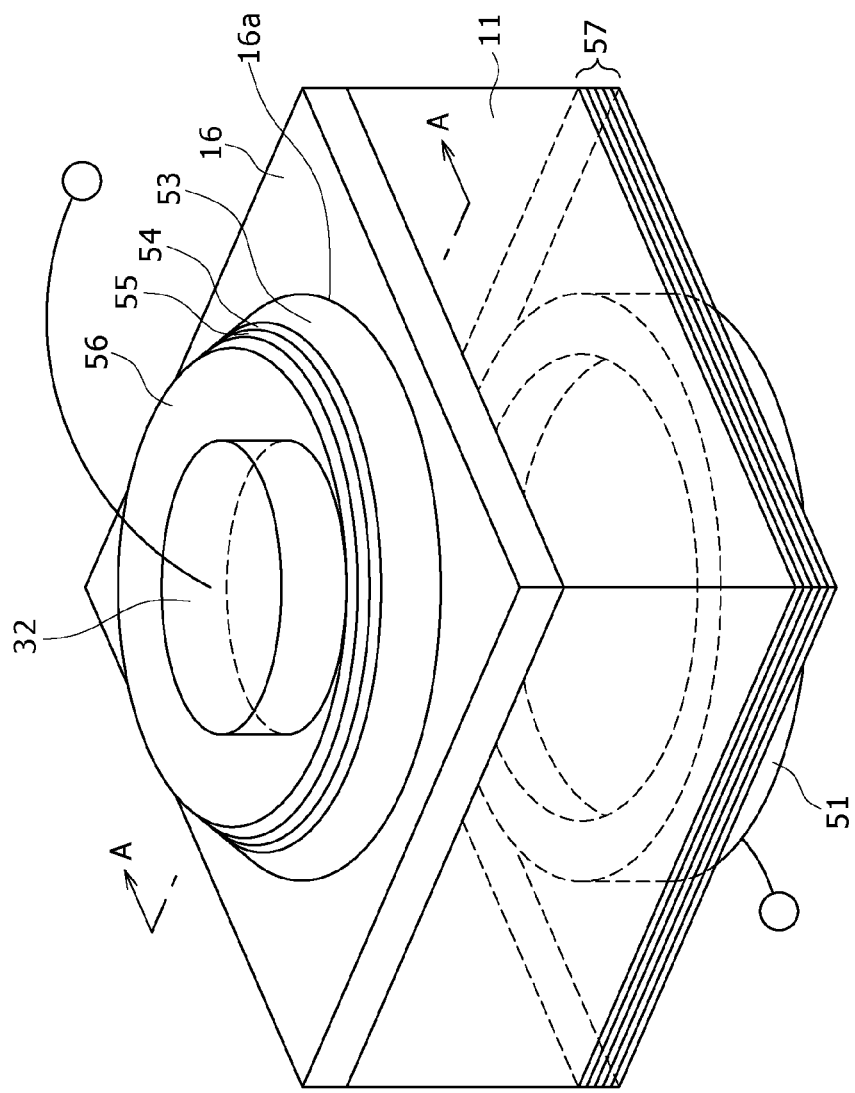
FIG. 38 is a perspective view for illustrating the method of manufacturing a surface emitting GaN semiconductor laser according to an eleventh embodiment of the present invention.
Figure 39A:
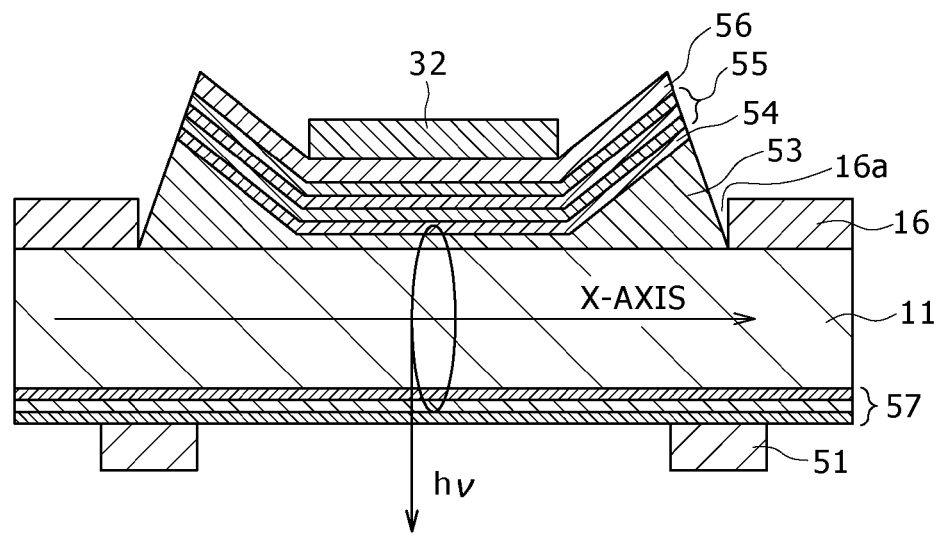
FIGS. 39A and 39B are respectively a sectional view of the surface emitting GaN semiconductor laser manufactured according to the eleventh embodiment of the present invention and a schematic diagram showing the distributions of In content and the total thickness of the grown layers.

Now, a vertical resonator surface emitting GaN semiconductor laser according to an eleventh embodiment of the present invention will be described below. FIGS. 38 and 39A illustrates the surface emitting GaN semiconductor laser. Here, FIG. 38 is a perspective view, and FIG. 39A is a sectional view taken along line A-A of FIG. 38.

As shown in FIGS. 38 and 39A, an insulating film mask 16 having a circular opening 16a is formed on an n-type GaN substrate 11. The diameter of the opening 16 may be, for example, about 20 to 30 μm, which is not limitative. Next, a lower AlGaN clad layer 53, an active layer 19, an upper AlGaN clad layer 54, a p-type DBR layer 55 and a p-type GaN contact layer 56 are sequentially grown epitaxially. An n-type DBR layer 57 is epitaxially grown on the back side of the n-type GaN substrate 11. The active layer 19 has an undoped $Ga_{1-x}In_xN$ (quantum well layer)/$Ga_{1-y}In_yN$ (barrier layer, x>y) multiple quantum well structure. The p-type DBR layer 55 includes a semiconductor multilayer film in which p-type $Al_zGa_{1-z}N$ layers and p-type $Al_wGa_{1-w}N$ layers (where z>w, 0<z, and w<1) are alternately stacked; for example, these layers are stacked up to 25 cycles, to obtain a total thickness of about 3 μm. The n-type DBR layer 57 includes a semiconductor multilayer film in which n-type AlN layers and n-type GaN layers are alternately stacked; for example, these layers are stacked up to 35 cycles, to obtain a total thickness of about 4 μm.

In this case, since the insulating film mask 16 has the opening 16a, the quantities of the Al atoms and Ga atoms supplied from over the insulating film mask 16 to the inside of the opening 16a are gradually increased along the diametral direction of the opening 16a. As a result of this, the thickness of the lower AlGaN clad layer 53 in this area is gradually increased as one goes along the diametral direction of the opening 16a of the insulating film mask 16 toward the center of the opening 16a. In a central area of the opening 16a, the quantities of the Al atoms and Ga atoms supplied from over the insulating film mask 16 are constant in the diametral direction of the opening 16a. As a result of this, the thickness of the lower AlGaN clad layer 53 is constant in this area. At the time of growth of the active layer 19, in addition to the In atoms and Ga atoms supplied into the inside of the opening 16a of the insulating film mask 16 directly from the growing raw materials, the In atoms and Ga atoms supplied from the growing raw materials onto the insulating film mask 16 are also supplied into this area (to contribute to the growth) through diffusion. In this case, since the diffusion length of the In atoms at the growth temperature (e.g., 700 to 800° C.) of the active layer 19 is smaller than that of the Ga atoms by a factor of about one order of magnitude, the In content of the active layer 19 is reduced in the portion near the edge of the opening 16a. Thence, the In content of the active layer 19 is again increased as one goes toward the central portion. As a result, the In content of the active layer 19 becomes uneven along the diametral direction of the opening 16a. Specifically, the In content in the portion near the opening 16a is lower than that in the other portion, so that the band gap energy in this is higher than the band gap energy in the other portion, and this portion forms a low-refractive-index region. On the other hand, since the In content in a central area of the opening 16a is high, the band gap energy in this area becomes low, and this area forms a high-refractive index region.

Next, a circular p-side electrode 32, for example, is provided on the p-type GaN contact layer 56 in the central area of the opening 16a in the insulating film mask 16. Subsequently, a ring-shaped n-side electrode 51 is provided on the n-type DBR layer 57 on the back side of the n-type GaN substrate 11.

Figure 39B:
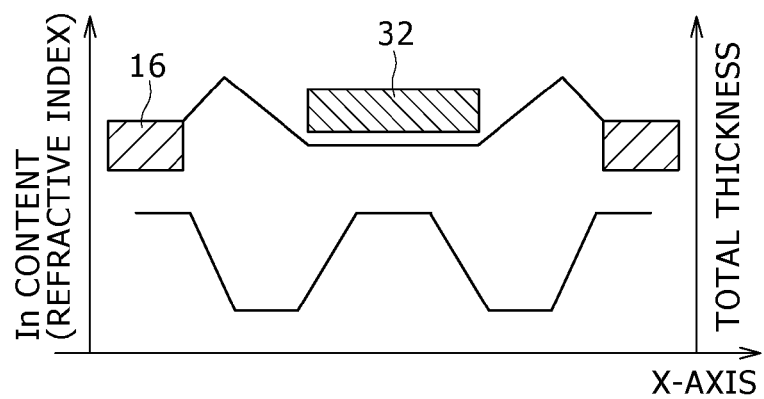

FIG. 39B shows distributions of the In content (refractive index) and the total thickness of the grown layers in the section shown in FIG. 39A.

According to the eleventh embodiment, a difference in refractive index can be produced between a central part of the GaN semiconductor layer for forming the laser structure and the outside thereof by a single run of epitaxial growth, whereby light can be confined in the central portion of the resonator. Therefore, it is possible to easily realize a surface emitting GaN semiconductor laser which has a low threshold current density and needs less operating current.

Now, a method of manufacturing a photonic crystal according to a twelfth embodiment of the present invention will be described below.

In the twelfth embodiment, as shown in FIG. 40, an insulating film mask 16 having a plurality of circular openings 16a in a two-dimensional array is formed on an n-type GaN substrate 11. In this case, the openings 16a in each x-direction array have the same diameter, but the openings 16a in each y-direction array are increased stepwise in diameter (for example, increased stepwise in the range of 5 to 100 μm). As shown in FIG. 41, an InGaN layer 58 is grown on the n-type GaN substrate 11 provided thereon with the insulating film mask 16. As a result, the InGaN layer 58 is grown in a cylindrical shape on the n-type GaN substrate 11 in the inside of each of the openings 16a. In this case, the In content of the InGaN layer 58 is higher as the diameter of the InGaN layer 58 is larger. Therefore, the refractive index is changed stepwise along the y-direction.

According to the twelfth embodiment, a photonic crystal including a two-dimensional array of InGaN layers 58 of which the refractive index is changed stepwise along one direction can be manufactured by a single run of epitaxial growth.

Incidentally, the shape of the openings 16a in the insulating film mask 16 is not limited to the circle, and may be an ellipse, for example. In addition, the InGaN layer 58 may be grown into a conical shape, for example.

While the embodiments of the present invention have been specifically described above, the invention is not limited to the above-described embodiments, and various modifications are possible based on the technical thought of the invention.

For example, the numerical values, structures, substrates, processes and the like mentioned in the embodiments above are merely examples, and numeral values, structures, substrates, processes and the like which are different from those mentioned above may also be used, if necessary.

Specifically, for example, while an edge of the insulating film mask 16 is located at an edge of the ridge stripe forming position 15 in the first, second, third, fifth and sixth embodiments, the insulating film mask 16 may be so formed that the edge of the insulating film mask 16 is located at a position spaced from the edge of the ridge stripe forming position 15.

Besides, two or more of the above-described first to tenth embodiments may be combined, as necessary.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a device having a longitudinally extending laser stripe structure at one end of which is an end face window structure, comprising:
    forming a mask over a substrate at least in the vicinity of the position of forming the end face window structure; and
    growing a nitride type Group III-V compound semiconductor layer including an active layer over the portion on the substrate not covered by the mask, the active layer having
    a nitride type Group III-V compound semiconductor material containing at least In and Ga by diffusing In and Ga into the nitride type Group III-V compound semiconductor layer grown over the portion on the substrate where the longitudinally extending laser stripe structure is to be formed,
    wherein,
        the nitride type Group III-V compound semiconductor layer which includes the nitride type group III-V compound semiconductor material containing the at least In and Ga has a length along the longitudinal extent of the portion on the substrate where the longitudinally extending laser stripe structure is to be formed,
        the nitride type Group III-V compound semiconductor which includes the nitride type group III-V compound semiconductor material containing at least In and Ga has a band gap energy that varies in relationship to the pattern of the mask along the longitudinal extent of the position on the substrate where the longitudinally extending laser strip structure is to be formed.

2. The method of claim 1, wherein the band gap energy is lower in a vicinity where the end face window structure is to be formed than not in the vicinity where the end face window structure is to be formed.

3. The method of claim 1, wherein band gap energy is higher where the end face window structure is to be formed than not where the end face window structure is to be formed.

4. The method of claim 1, wherein the band gap energy is lowest where the lateral distance between said mask and the portion where the longitudinally extending laser stripe structure is to be formed is shortest.

5. The method of claim 1, wherein the lateral distance is shortest in the vicinity of the end face window structure than not in the vicinity of the end face window structure.

6. The method of claim 1, wherein the lateral distance is largest in the vicinity of the end face window structure than not in the vicinity of the end face window structure.

7. The method of claim 1, wherein the mask includes portions on both sides of the portion where the longitudinally extending laser stripe structure is to be formed.

8. The method of claim 1, wherein the mask is located only on one side of the portion where the longitudinally extending laser stripe structure is to be formed.

9. The method of claim 1, wherein the forming the mask step comprises forming two film masks having a stripe shape with a width w, the two film masks in paralegal with each other and separated by a spacing d.

10. The method of claim 1, wherein the forming the mask step comprises an insulating film.

11. The method of claim 10, wherein the insulating film comprise a $SiO_2$ film, a SiN film, or an $Al_2O_3$ film.

12. The method of claim 1, wherein the mask comprises a trapezoidal-shaped structure or a rectangular-shaped structure.

13. The method of claim 1, wherein the nitride type Group III-V compound semiconductor comprises $Al_xB_yGa_{1-x-y-z}In_zAs_uN_{1-U-v}P_v$, where $0 \leq x \leq 1$, $0 \leq y \leq 1$, $0 \leq z \leq 1$, $0 \leq u \leq 1$, $0 \leq v \leq 1$, $0 < x+y+z < 1$, $0 < u+v < 1$.

14. The method of claim 1, wherein the nitride type Group III-V compound semiconductor comprises a material selected from a group of materials consisting of GaN, InN, AlN, AlGaN, InGaN, and AlGaInN.

15. The method of claim 1, wherein the nitride type Group III-V compound semiconductor containing at least In and Ga includes $AlxByGa_{1-x-y-z}In_zAs_uN_{1-U-v}P_v$, where $0 \leq x \leq 1$, $0 \leq y \leq 1$, $0 \leq z \leq 1$, $0 \leq u \leq 1$, $0 \leq v \leq 1$, $0 \leq x+y+z < 1$, $0 \leq u+v < 1$.

16. The method of claim 1, wherein the nitride type Group III-V compound semiconductor containing of at least In and Ga including InGaN and AlGaInN.

17. The method of claim 1, wherein the growth step comprises an epitaxial growth method selected a group of epitaxial growth methods consisting of organic chemical vapor deposition (MOCVD), hydride vapor phase epitaxy or halide vapor phase epitaxy (HVPE), and molecular beam epitaxy (MBE).

18. The method of claim 1, wherein the device comprises a semiconductor laser.

19. The method of claim 18, wherein the semiconductor laser comprises a vertical cavity surface emitting laser (VCSEL).

20. The method of claim 1, wherein the device comprises a light emitting diode.

21. The method of claim 1, wherein the device comprises an optical component selected from a group consisting of convex lens and photonic crystals.

* * * * *

UNITED STATES PATENT AND TRADEMARK OFFICE
CERTIFICATE OF CORRECTION

| | | |
|---|---|---|
| PATENT NO. | : 8,202,750 B2 | |
| APPLICATION NO. | : 12/038329 | |
| DATED | : June 19, 2012 | |
| INVENTOR(S) | : Masaru Kuramoto et al. | |

It is certified that error appears in the above-identified patent and that said Letters Patent is hereby corrected as shown below:

On the face page of the patent:

The Foreign Application Priority Data is missing. Please add:

(30) Foreign Application Priority Data

--Feb. 28, 2007   (JP)   P2007-050461--

Signed and Sealed this
Thirtieth Day of October, 2012

David J. Kappos
*Director of the United States Patent and Trademark Office*